United States Patent [19]
Tsunoi et al.

[11] Patent Number: 5,216,296
[45] Date of Patent: Jun. 1, 1993

[54] LOGIC CIRCUIT HAVING SHARPER FALLING EDGE TRANSITION

[75] Inventors: Hiroyuki Tsunoi, Yokohama; Kazumasa Nawata; Toshiaki Sakai, both of Kawasaki; Hiroki Yada, Chigasaki; Hisayosi Ooba, Kawasaki; Takayuki Tsuru; Satoru Sudo, both of Tokyo; Taichi Saitoh, Yokohama, all of Japan

[73] Assignee: Fujitsu Limited, Kawasaki, Japan

[21] Appl. No.: 896,929

[22] Filed: Jun. 11, 1992

Related U.S. Application Data

[63] Continuation of Ser. No. 584,143, Sep. 18, 1990, abandoned.

[30] Foreign Application Priority Data

Sep. 18, 1989 [JP] Japan .................. 1-240136
Nov. 2, 1989 [JP] Japan .................. 1-286103
Dec. 28, 1989 [JP] Japan .................. 1-339451

[51] Int. Cl.$^5$ .............. H03K 17/56; H03K 5/12; H03K 19/086
[52] U.S. Cl. .................. 307/455; 307/456; 307/246; 307/263; 307/270
[58] Field of Search ............... 307/443, 454–456, 307/242, 246, 270, 446, 475, 263

[56] References Cited

U.S. PATENT DOCUMENTS

| | | | |
|---|---|---|---|
| 4,539,493 | 9/1985 | Varadarajan | 307/455 |
| 4,626,709 | 12/1986 | Mazunder et al. | 307/455 |
| 4,680,480 | 7/1987 | Hopta et al. | 307/270 |
| 4,998,029 | 3/1991 | Sundstrom | 307/455 |
| 5,041,743 | 8/1991 | Matsumoto | 307/455 |

Primary Examiner—William L. Sikes
Assistant Examiner—Margaret Rose Wambach
Attorney, Agent, or Firm—Staas & Halsey

[57] ABSTRACT

A logic circuit in which first and second transistors are connected in series between high and low potential power sources with the middle point of the series connection used as the output terminal; A same- and inverse-phase signal generating unit is provided connected between the high and low potential power sources in parallel with the first and second transistors for generating same- and inverse-phase signals based on the single input signal output from the logic circuit. A transient signal generating unit is provided for generating transient large current signals at the rise time of the inverse-phase signals and generating transient cut-off signals at the fall time of the inverse-phase signals. The series connected first transistor is driven and controlled based on the regular-phase signals, while the second transistor is driven and controlled based on the transient large current signal and transient cut-off signal, thus producing an inverse-phase output by a simple circuit construction.

31 Claims, 18 Drawing Sheets

LOGIC CIRCUIT HAVING SHARPER FALLING EDGE TRANSITION

This application is a continuation of application Ser. No. 07/584,143, filed Sep. 18, 1990, now abandoned.

BACKGROUND OF THE INVENTION

1. Field of the Invention

This invention relates to a logic circuit, more particularly an emitter coupled logic(ECL) circuit whose operational speed is increased by reducing the discharge time of charges accumulated in a load capacitance while preventing increase of power consumption.

ECL circuits are often used as logic circuits in high performance systems such as large-sized computers, work stations, and measuring instruments due to their high speed characteristics. With recent improvements in system performance, ECL logic circuits are required to be higher in speed and integration density. But the greater the integration, the greater the power consumption and the more the delay in long wiring cannot be ignored. Therefore it is necessary to realize a low power consumption and high-speed operation of the circuit in long wiring.

2. Description of the Related Art

ECL logic circuits are high-speed digital circuits composed of a current made logic (CML) circuit and emitter-follower transistor added to improve the load driving capacity.

To one of the bases of transistors of the CML circuit is input a fixed reference voltage V ref (central voltage value of logical amplitude), which becomes the threshold voltage of the circuit. The output voltage is characterized in that both positive and negative outputs (OR and NOR logical outputs) can be taken out.

Since a wiring load capacitance CL exists at the output side of the ECL logic circuit, the charging and discharging time of charges accumulated in this wiring load capacitance CL is one of the factors determining the circuit operation speed.

If the wiring load capacitance CL is large, it takes the output a longer time to change from the H level to the L level than from L level to the H level.

This means that the time change from the H level to L level and from the L level to H level is unbalanced, causing problems in design, construction, and use.

These problems can be solved by using a circuit which discharges the wiring load capacitance at a low impedance when the output changes from the H level to L level in place of a pull-down resistance or constant current source.

As such a circuit, there is an active pull-down ECL logic circuit as shown in FIG. 1. In FIG. 1, numeral 1 denotes an active pull-down ECL logic circuit (OR/-NOR circuit) which consists of the CML circuit (ECL logic part) 2 made of emitter-coupled transistors Q1 and Q2, a constant current transistor Q3, resistors R1, R2, and R3; the emitter-follower circuit 3 made of an emitter-follower transistor Q4, pull-down transistor Q5, and emitter-follower resistor R4; and the emitter-follower circuit 4 made of an emitter-follower transistor Q6, pull-down transistor Q7, and emitter-follower resistor R5. The base of pull-down transistor Q5 is connected to the collector of the transistor Q1 via a capacitor C1, whose signals are inversed in phase to the signals applied to the base of the emitter-follower transistor Q4. Similarly, the base of the pull-down transistor Q7 is connected to the collector of the transistor Q2 via a capacitor C2, whose signals are inversed in phase to the signals applied to the base of the emitter-follower transistor Q6. Note, numerals 11 and 12 denote the input terminals where input signals Vin1 and Vin2 are input, and 13 and 14 denote the output terminals from which the output signals Vout1 and Vout2 are output. Vcs1 is the control voltage, GND the high potential power source (positive power source), and $V_{EE1}$ the low potential power source (negative power source).

For instance, at the NOR logic output in the above construction, if Vin1 is at a lower level "L" than Vin2, Q1 is off and Q2 is on, with Q1's collector potential (S NOR) being at a low potential level defined as the positive power source (GND) minus the voltage drop across R1. If Vin1 changes from "L" to "H", SNOR changes from a low potential to a high potential near GND.

In this case, the NPN transistor Q5 is usually on when sending the output level from the output terminal 13, and when Q5 changes, its current flow is instantaneously increased by the current flowing through the capacitor C1. The same operation occurs in the transistor Q7. In other words, in the active pull-down ECL circuit 1, the control voltage V cs1 is always applied to the bases of Q5 and Q7 to turn them on in order to produce the output level. Only when Q5 and Q7 are changed is the current flowing through them increased by the current momentarily flowing through the capacitors C1 and C2 (which block DC) to improve the load driving force. Then the charges are promptly discharged from the wiring load capacitance CL via Q5, resistor R4, Q7, and resistor R5 to switch from the level H to the level L at high speed.

In this conventional active pull-down ECL logic circuit, however, Vcs1 must be applied to the transistors Q5 and Q7 at all times to keep them turned on, which results in increased power consumption, making it necessary to increase the transistor size. The increased junction and wiring capacity can obstruct high speed operation while the increased gate size prevents high integration of transistors.

Other methods to solve the above problem are disclosed in the U.S. Pat. No. 4,539,493 in which, in the two output circuits used in the ECL logic circuit, the bases of the pull-up transistors in these output circuits are connected to each other via a capacitor. The base of the pull-up transistor of one output circuit is connected to the base of the emitter-coupled transistor of the other output circuit, and the base of the pull-up transistor of the other output circuit is connected to the emitter of the emitter-coupled transistor of the other output circuit. However, these prior arts cannot overcome the drawback that a capacitance C is added to the current switch causing a delay in switching operation of ECL, and that the pull-down transistor Q5 is always on, resulting in large power consumption.

SUMMARY OF THE INVENTION

The object of this invention is to provide a logic circuit which can actively lower the output voltage level while controlling the increase of power consumption and thus contribute to making a high-speed and highly integrated circuit.

A logic circuit, especially an ECL logic circuit, according to the present invention has the following technical construction to achieve the aforesaid purpose. Namely, the logic circuit according to this invention comprises a logic circuit containing an emitter-coupled transistor which is composed of first and second transistors, the collectors of which are both connected to a second power source and the emitters of which are commonly connected to a constant current source connected to a first power source.

Input signals are input to the base of each transistor and the output signal in the same or inverse phase as the input signals output from each collector of both transistors; an output circuit comprising an emitter-follower transistor having its base connected to the collector of at least one transistor of the logic circuit having its collector connected to a second power source and having its emitter connected to an output terminal; a pull-down transistor having its collector connected to the emitter of the emitter-follower transistor and its emitter connected to a third power source; a control voltage terminal which is connected to the base of the pull-down transistor and a pulse greater than the threshold voltage of the pull-down transistor is input at the instant the logic level at the output terminal changes from high to low. A resistor which is inserted between the emitter-follower transistor and a fourth power source.

According to the present invention, resistors R11 and R12 are inserted between emitter-follower transistors Q4 and Q6 of the emitter circuit and a fourth power source V EE2.

Therefore the emitter-follower current flowing through the transistors Q5 and Q7 flow through the resistors R11 and R12, and Q5 and Q7 are off at the usual time. At the switch time, the pulse higher than the threshold voltage is input to the base of transistors Q5 and Q7 and they operate to actively lower the output voltage level. As a result, it becomes possible to make the circuit operate with a high speed at a low power consumption even if the wiring load is large the actively lower the output voltage level.

BRIEF DESCRIPTION OF THE DRAWINGS

FIGS. 3 through 6 show the first embodiment of a logic output circuit according to the present invention, FIG. 3 is a circuit diagram, FIG. 5 is a graph showing the cut-off frequency $F_T$ characteristics in the first embodiment, FIG. 6 is a graph for explaining the problems caused by an increase in transistor size.

DETAILED DESCRIPTION OF THE PREFERRED EMBODIMENTS

Concrete examples of the logic output circuit according to the present invention will hereinafter be explained in detail referring to the accompanying drawings.

Figure 1:
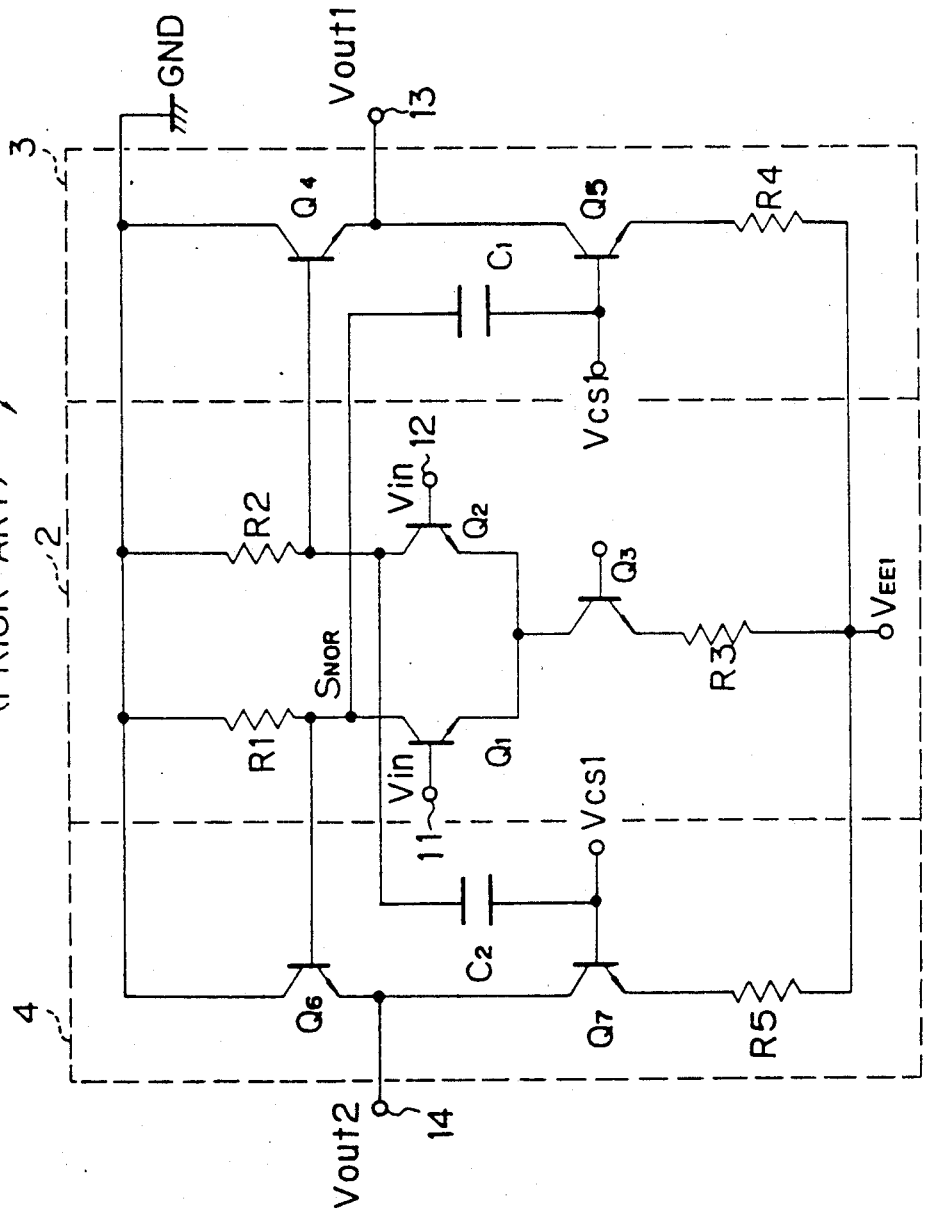
FIG. 1 is a circuit diagram illustrating a conventional logic output circuit.
Figure 2:
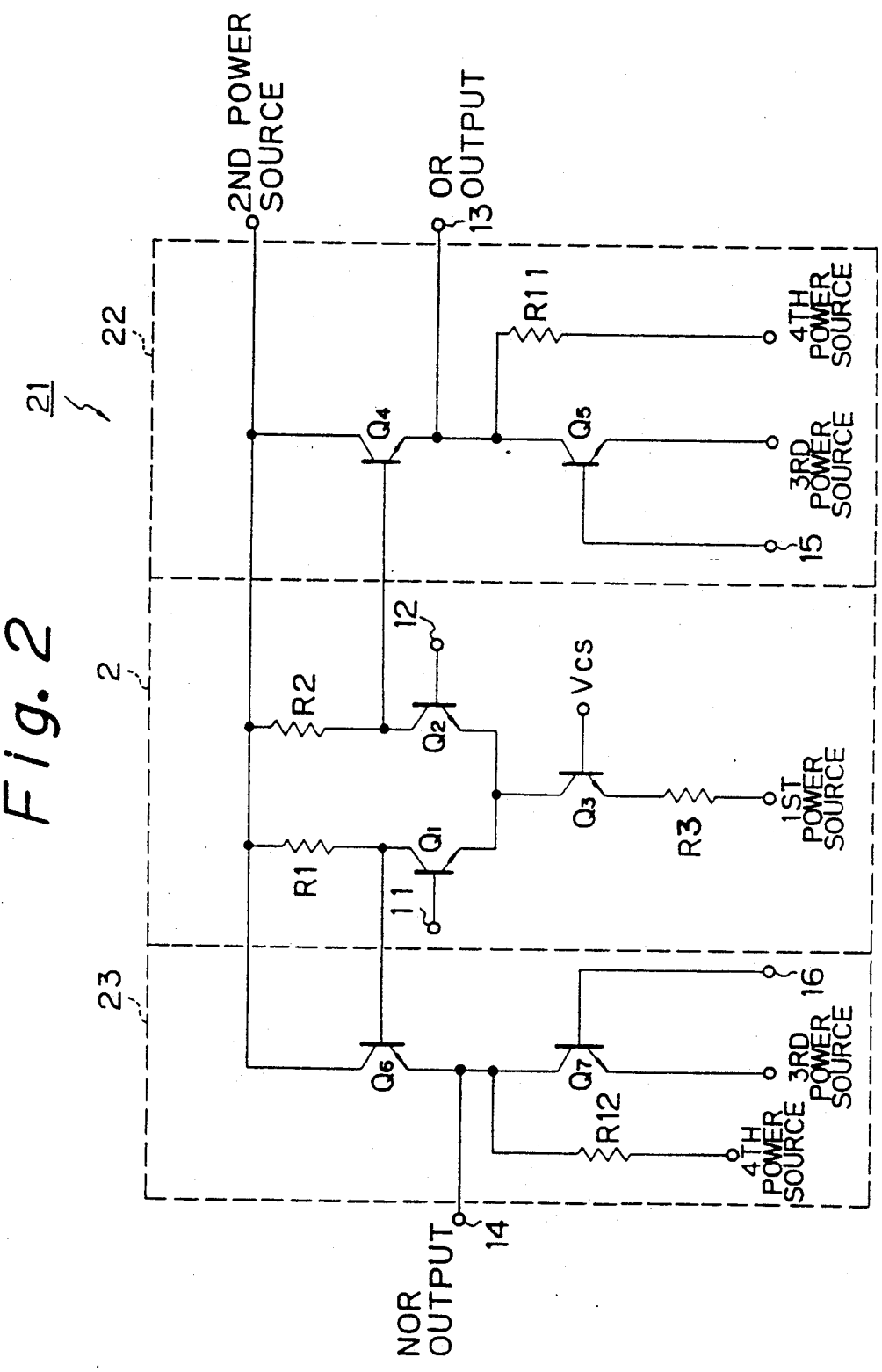
FIG. 2 is circuit diagram of the present invention.

FIG. 2 is a circuit diagram of an ECL logic output circuit according to the present invention, in which the same numbers are given to components which correspond to the same components in the conventional circuit shown in FIG. 1.

In FIG. 2, numeral 21 shows an active pull-down ECL logic circuit (ECL logic circuit). This circuit 21 is composed of a CML circuit (ECL logic circuit) 2 consisting of emitter-coupled transistors Q1 and Q2, constant current transistor Q3, resistors R1, R2, and R3; an emitter-follower circuit (OR output) 22 for receiving signals from the transistor Q2 and driving an external load; and an emitter-follower circuit (NOR output) 23 for receiving signals from Q1 and driving an external load.

The emitter-follower circuit 22 comprises an emitter-follower transistor Q4, the base of which is connected to the collector of emitter-coupled transistor Q2 of ECL logic circuit 2, the collector of which is connected to a second power source and the emitter of which is connected to an output terminal 13 (OR); a pull-down transistor Q5, the collector of which is connected to a emitter of the emitter-follower transistor Q4, and the emitter of which is connected to a third power source; a control voltage terminal 15 connected to the base of the pull-down transistor Q5 and receiving a pulse higher than the threshold voltage (threshold value=V ref) of pull-down transistor Q5 at the instant the logic level at the output terminal 13 changes from high to low; and a resistor R11 inserted between the emitter-follower transistor Q4 and a fourth power source.

Similarly the emitter-follower circuit 23 comprises an emitter-follower transistor Q6, the base of which is connected to the collector of the emitter-coupled transistor Q1 of ECL logic circuit 2, the collector of which is connected to a second power source, and the emitter of which is connected to an output terminal 14 (NOR); a pull-down transistor Q7 the collector of which is connected to the emitter of the emitter-follower transistor Q6 and the emitter of which is connected to a third power source; a control voltage terminal 16 connected to the base of the pull-down transistor Q7 and receiving a pulse higher than the threshold voltage of the pull-down transistor Q7 at the instant the logic level at the output terminal 14 changes from high to low; and resistor R12 inserted between the collector of pull-down transistor Q7 and a fourth power source.

At the moment when the OR output terminal 13 changes from "H" to "L", a pulse higher than the threshold voltage (threshold value=V ref) is applied to the base of pull-down transistor Q5 from the control voltage terminal 15. Similarly, a pulse higher than the threshold voltage (threshold value=V ref) is applied to the base of pull-down transistor Q7 from the control voltage terminal 16 at the moment when the NOR output terminal 14 changes from "H" to "L".

In this circuit 21, therefore, Q5 and Q7 can normally be kept off and the current flows from the emitter-follower through the resistors R11 and R12. Namely, current usually flows through R11 (or R12) while keeping the transistor Q5 (and Q7) turned off.

At the moment the logic level at the output terminal 13 and 14 changes from high to low, a pulse higher than the threshold voltage of the pull-down transistor is input to the base of transistor Q5 (or Q7) to turn it on and lower the output voltage level.

It thus becomes possible to actively lower the output voltage level while preventing an increase in consumption, allowing an increase in circuit operation speed and a higher level of integration.

In this embodiment, the emitter-follower output circuits 22 and 23 were arranged to connect to the respective outputs from the ECL logic circuit 2, but only one emitter-follower circuit may be used.

It can freely be decided whether a NOR or OR output is used. This invention can of course apply when two outputs (such as OR/NOR, or AND/NAND) are obtained at once from the ECL logic circuit.

Figure 7:
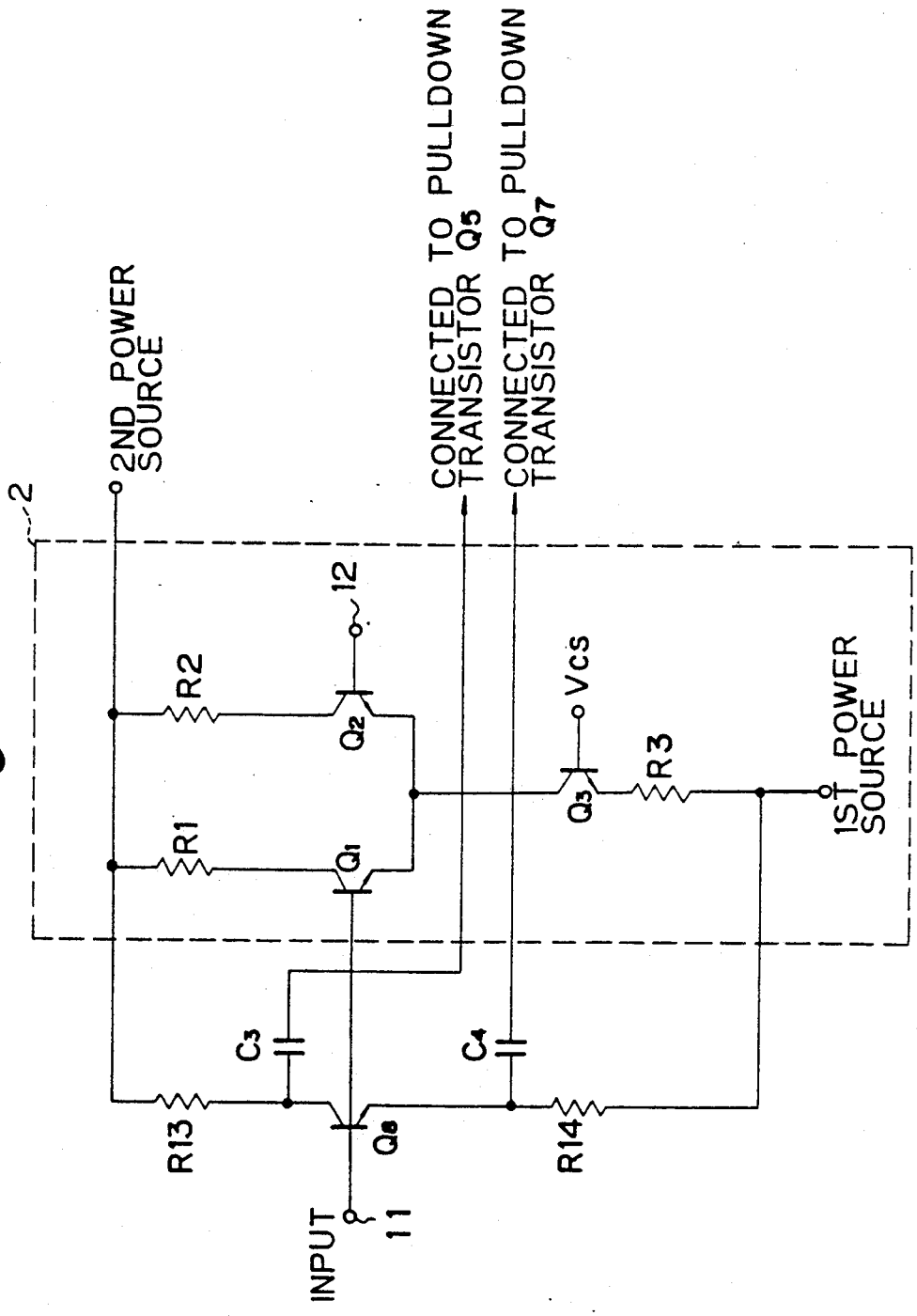
FIG. 7 is a circuit diagram of the second embodiment of a logic output circuit according to the present invention.

According to the present invention, a circuit as shown in FIG. 7, for example, is used to detect the timing when the output from the emitter-follower output circuit changes from "H" to "L", and generate a pulse to be applied to either control voltage terminal 15 or 16, thereby momentarily turning on the corresponding pull-down transistor Q5 or Q7 and discharging the charges from the load connected to the output 13 through the transistor Q5 or Q7, thus considerably improving the switching operation of the circuit.

In the above embodiment, a first and a third power sources may be the same power.

FIGS. 3 through 6 relate to the first embodiment of an ECL logic circuit according to the aforesaid principle. The same reference numerals are given to the same components as in the convertional system in FIG. 1 or in the explanations of FIG. 2.

Figure 3:
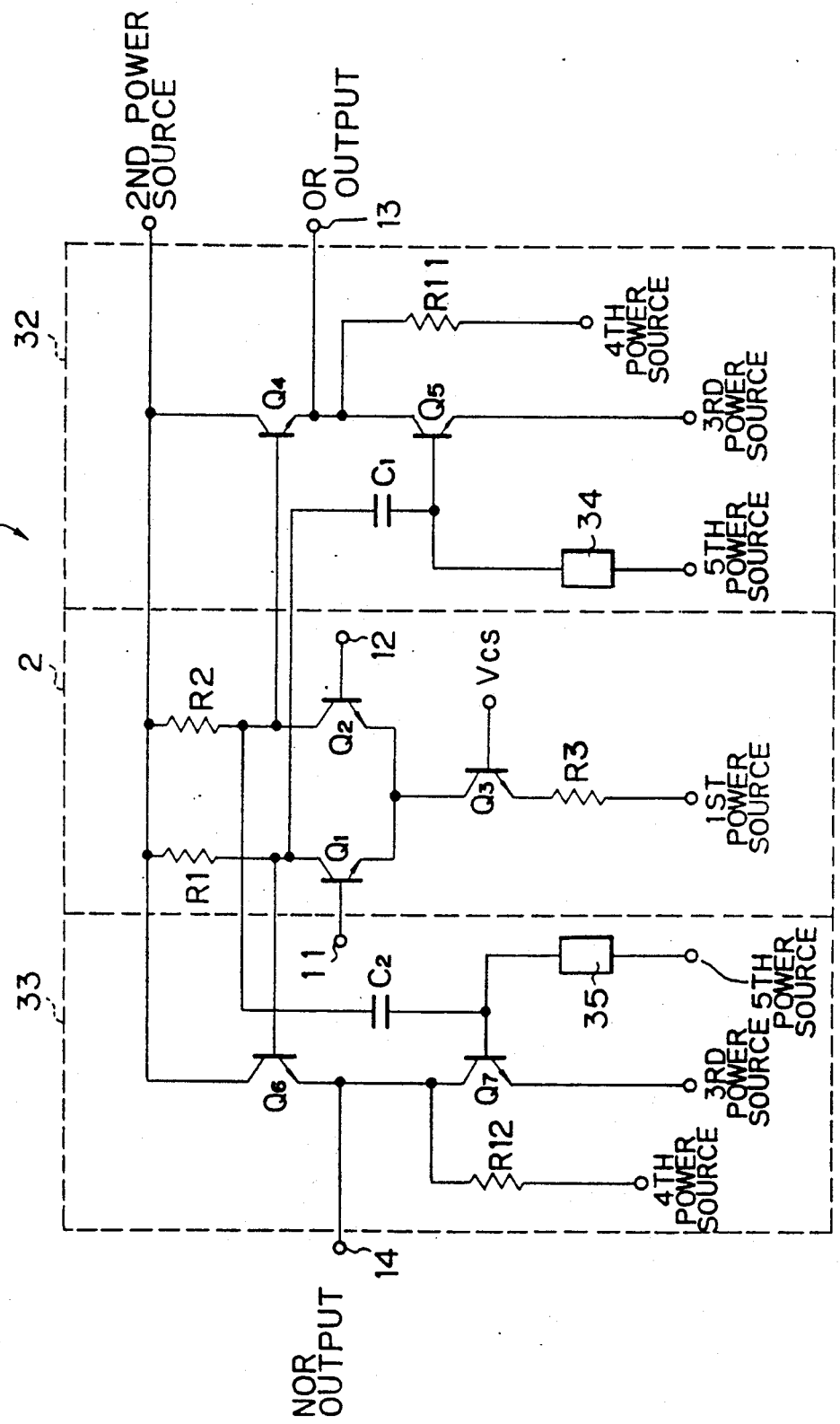

First, the construction of the first embodiment will be explained. In FIG. 3, numeral 31 shows an active pull-down ECL logic circuit (ECL logic circuit), which comprises a CML circuit (ECL logic) 2 consisting of an emitter-coupled transistor Q1, Q2 and a constant current transistor Q3 and resistors R1, R2, and R3; an emitter-follower circuit (OR output part) 32 for receiving the signals appearing at the transistor Q2 and driving an external load; and an emitter-follower circuit (NOR output part) 33 for receiving the signals from the transistor Q1 and driving an external load.

The emitter-follower circuit 32 comprises an emitter-follower transistor Q4 receiving the Q2 collector potential at its base; a pull-down transistor Q5, the collector of which is connected to the emitter of the emitter-follower transistor Q4, and the base of which is connected 60 via the capacitor C1, to the collector of the emitter-coupled transistor Q1, whose output is inversed in phase to that at the base of emitter-follower transistor Q4, and at the same time, is connected to a fifth power source via a level shift means 34 consisting of a transistor, diode, resistor etc.; and a resistor R11 inserted between the emitter-follower transistor Q4 and the fourth power source.

Similarly the emitter-follower circuit 33 comprises an emitter-follower transistor Q6 receiving the Q1 collector potential at its base; a pull-down transistor Q7, the collector of which is connected to the emitter of the emitter-follower transistor Q6, and the base of which is connected via the capacitor C2, to the collector of emitter-coupled transistor Q2, whose output is inversed in phase to that at the base of emitter-follower transistor Q6, and at the same time is connected to a fifth power source via the level shift means consisting of a transistor, diode, resistor, etc.; and a resistor R12 inserted between the emitter-follower transistor Q6 and a fourth power source. Therefore the active pull down ECL logic circuit 31 has a circuit construction where resistors R11 and R12 are inserted in parallel with the active pull-down ECL logic circuit shown in FIG. 1.

As is clear from the above explanation, the capacitors C1 and C2 in this embodiment are equivalent to the aforesaid control voltage generating means.

In this embodiment with the above-mentioned construction, the emitters of Q4 and Q6 are connected to a fourth power source $V_{EE2}$ via resistors R11 and R12.

Therefore the conventional system has to keep its pull-down transistors Q5 and Q7 turned on at all times, causing increased power consumption, while in this embodiment, the transistors Q5 and Q7 can normally be kept off by allowing the emitter-follower current to flow through resistors R11 and R12.

More specifically, the DC emitter-follower current flows through R11 (or R12) when the transistors Q5 (and Q7) are off. But when the output is changed from "H" to "L", a short signal (pulse) higher than the threshold voltage $V_{BE}$ between the base and emitter of Q5 is generated at the capacitor C1 (or C2), and is applied to the transistor Q5 (or Q7) to operate it to actively lower the output voltage level. Namely, the emitter-follower current normally flows through resistor R11 (and R12) (in the case of DC) and transistors Q5 (and Q7) are turned off.

Further in this circuit 31, low power consumption can be achieved by using the first and fourth power sources, and making the latter which is connected to R11 and R12 smaller in potential than the former.

If they are made to have the same potential, the power consumption cannot be reduced, but the wiring for the two power sources can be combined into one. Since AC current flows through the capacitor C1 (or C2) connected to the transistor Q5 (or Q7) at the time of switching, the transistor Q5 (or Q7) operates to positively lower the voltage level.

In the first embodiment, the effects derived from making the first power source smaller in potential than the fourth power source will be explained in comparison with a conventional system.

In the present embodiment, five different power sources are used as explained above and the relationship among these potentials of respective power sources each other, will be explained hereunder.

Note, that in the present embodiment, the first power source has the most lowest potential while the second power source is has the most highest potential in the circuit of this embodiment.

As explained above, the second power source may be contacted to the earth.(GND), and thus the first power source may have a certain minus voltage, for example, $-5$ V.

On the other hand, the fourth power source must have a potential higher than that of the third power source while less than that of the second power source.

The third power source may have the same potential as that of the fifth power source and therefore the third power source may be commonly used for the fifth power source and vice-versa.

But, a specific potential level for each one of the first, the third and the fifth power sources is not restricted.

Figure 4A:
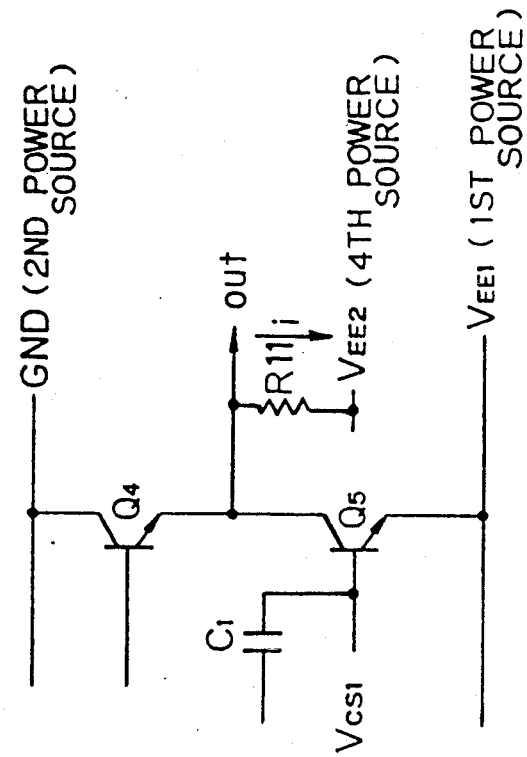
FIGS. 4a and 4b show the main part of the circuit to explain the effects of the present invention.
Figure 4B:
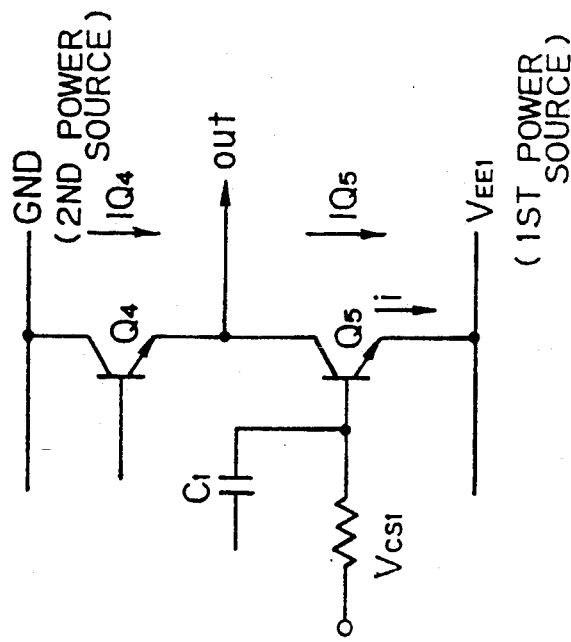

FIG. 4 (a) shows a main part of the circuit diagram of the conventional active pull-down ECL logic circuit 1 as shown in FIG. 1, and FIG. 4(b) shows a main part of the circuit of the active pull-down ECL logic circuit 31.

In the conventional circuit in FIG. 4(a), a control voltage $V_{CS1}$ applied to transistor Q5 must be at a potential that will keep Q5 turned on in order to produce the output voltage $V_{OH}/V_{OL}$. The power consumption thus becomes $V_{EE1} \times i$ with i being the emitter-follower current.

In the embodiment shown in FIG. 4(b), a resistor R11 is inserted between the emitter of emitter-follower transistor Q4 and a negative power source $V_{EE2}$ (a fourth power source) to generate the output voltage $V_{OH}/V_{OL}$.

Therefore, if the same current i is made to flow, the require power consumption is $V_{EE2} \times i$, which can be small if $|V_{EE2}| < |V_{EE1}|$.

Since $V_{CS1}$ is set lower than in the conventional system in FIG. 4(a), the transistor Q5 is normally off.

In the conventional system as shown in FIG. 4(a), the emitter/collector current in Q4 (IQ4) is equal to the emitter/collector current in Q5 (IQ5).

When this current is large, large transistors must be used for both Q4 and Q5.

However, in this embodiment, the transistor Q5 can be reduced in size in proportion to the amount of the current flowing through resistor R11.

Incidentally, the resistor used in a usual ECL circuit can be used for R11 and R12.

Figure 5:
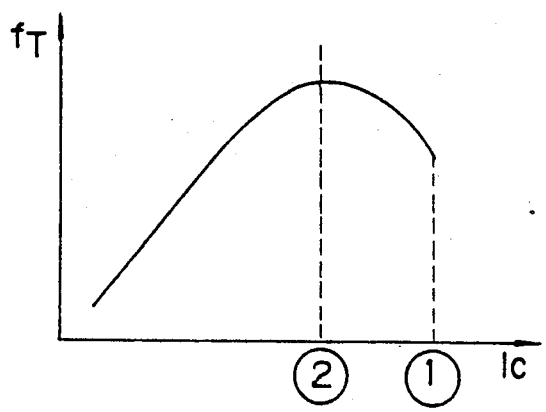

In the conventional system in FIG. 1, the circuit is used where the cut-off frequency $f_T$ is low as shown in FIG. 5 ①, since the Q5 collector current Ic is large.

Figure 6:
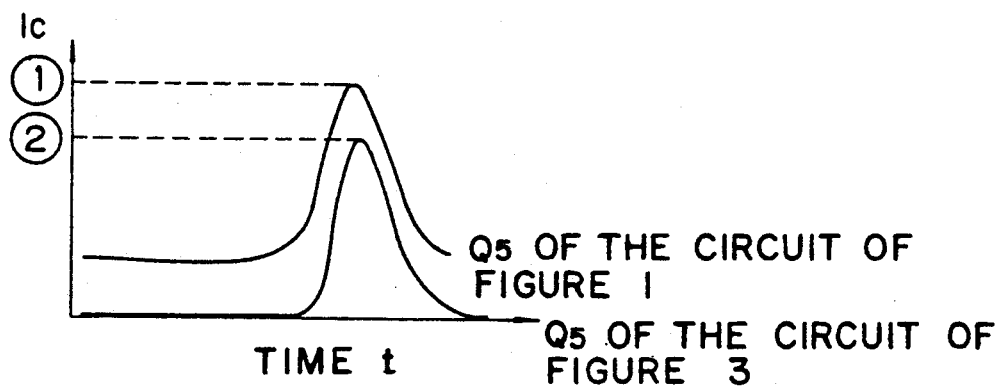

To avoid this, in the active pull-down ECL logic circuit 31 of the first embodiment, a transistor whose $f_T$ reaches the peak at the place where Ic is large as shown in FIG. 6 ① must be used.

Therefore the transistor size has to be large, leading to the increased junction and wiring capacities and the lowered operation speed or otherwise the increased gate size.

There is no problem in the circuit 21 in the present embodiment as it can be used at the place where $f_T$ is high as shown in FIG. 5 ②.

As explained above, this embodiment has the effect of allowing circuit operation at high speed in order to actively lower the voltage level even if the wiring load CL is large. Further the circuit can considerably contribute to reduced power consumption because the transistor Q5 (and Q7) is normally kept off, and a fourth power source $V_{EE2}$ is used to make the current flow through resistor R11 (and R12).

Furthermore, since it is only necessary to turn this transistor on when the output changes from "H" to "L", the transistor Q5 or Q7 can be made smaller in size than the transistor used in the conventional circuit, and therefore is more advantageous for high integration.

In this embodiment, the voltage applied to the emitter-follower transistor Q4 and the inverse phase of the voltage applied to the base of pull-down transistor Q5 are obtained from the collector of each transistor of the ECL logic circuit. Since these voltages are applied via a capacitor, transient signals occur in inverse phase relative to the input signals, which can shorten the turn-on time of the pull-down transistor.

Also in this embodiment, the input 11 can be replaced by multiple inputs.

Next, other characteristics of the present invention will be explained as a second embodiment.

FIG. 7 is a circuit diagram of another embodiment of an ECL logic circuit according to the present invention, showing a circuit for generating a control voltage to be applied to the base of pull-down transistor Q5 or Q7 of the ECL logic circuit 21 shown in FIG. 2. Only the part where the control voltage output is input to the ECL logic circuit is different from the circuit in FIG. 2, so the identical circuit construction is omitted and only the main part will be explained.

Like the ECL logic circuit 31 shown in FIG. 3, this circuit does not derive a Q1 or Q2 collector potential from the ECL logic 2 via capacitors C1 and C2, but incorporates a transistor Q8 and resistors R13 and R14 into the input section of ECL logic part 2 as shown in FIG. 7, and connects the collector and emitter of transistor Q8 to the bases of OR pull-down transistor Q5 and NOR pull-down transistor Q7 via capacitors C3 and C4, respectively.

Therefore pulses take place from capacitor C3 or C4 depending on changes in input, and are applied instuntaneously to the bases of pull-down transistors Q5 and Q7. The subsequent circuit operations are the same as in the circuit of the first embodiment.

In this embodiment, the circuit construction is shown of a control voltage generating means which simultaneously controls the pull-down transistor Q5 of the OR output section 2 and the pull-down transistor Q7 of the NOR output section 23.

Needless to say, this embodiment can adopt a construction that controls the pull-down transistor of either the OR output section 22 or the NOR output section 23.

Figure 16:
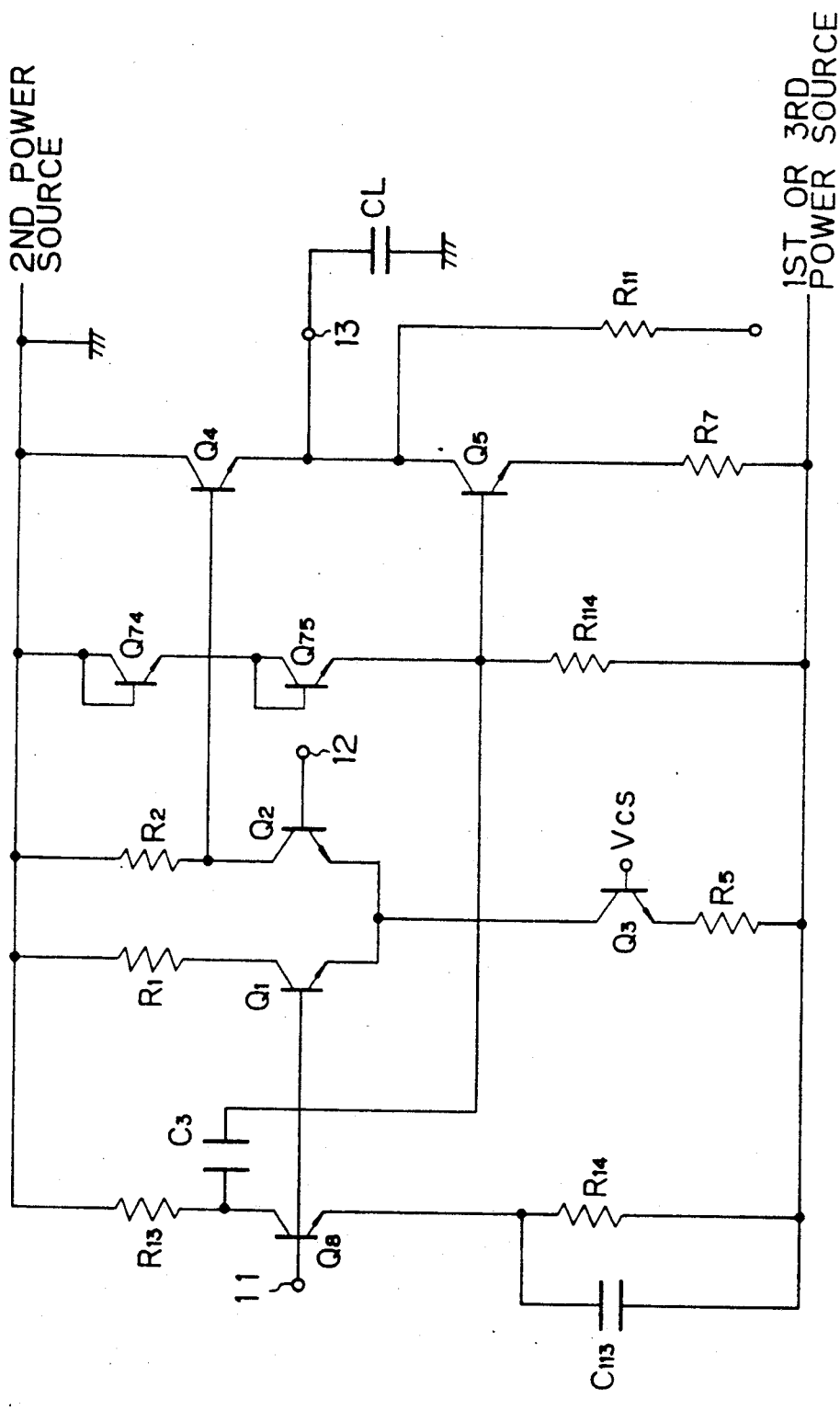
FIGS. 16 through 20 show another embodiments of the present invention.

FIG. 16 shows the control voltage generating circuit developed by improving the above-mentioned control voltage generating means.

FIG. 16 shows an input circuit section (pulse generating circuit) consisting of a transistor Q8, resistors R13 and R14, with the OR output section 22 being used as an active pull-down, to which is added a speed-up capacitor C113 to improve the operation speed. The speed-up capacitor C113 is added to both ends of resistor R14 at the emitter side of transistor Q8.

By adding the speed-up capacitor C113 to both ends of the resistor R14, the AC impedance can be reduced and transient current can be made to flow through the capacitor C113, so that a pulse can quickly be generated and applied to the base of active pull-down transistor Q5. Therefore the higher the input signal frequency is, the greater the effect of capacitor 113 becomes.

Incidentally, this capacitor C113 is only effective when accelerating the OR output.

The value of this speed-up capacitor C113 is chosen according to the added wiring capacity CL for the following reasons.

If the added wiring capacity CL is small, the amplitude of undershoot (relaxation vibrations at the pulse fall time) generated at the output terminal 13 increases. In this case, when the voltage at output terminal 13 drops from the H level to L level, a ringing phenomenon occurs where the voltage excessively drops passing the ordinary L level downward and then turns to rise slightly higher than the ordinary L level.

This phenomenon causes a malfunction of the ECL circuit if the increased voltage level (not shown) exceeds the threshold voltage level (threshold value=Vref) of the input-side transistor of the ECL circuit connected to a subsequent stage.

For this reason, the speed-up capacitor C113 should have an appropriate value according to the added wiring capacity CL.

If this speed-up capacitor C113 is made variable according to the added wiring capacity CL, and it is small, the speed-up capacitor can be made zero or a very small value, and if the capacitor CL is large, the speed-up capacitor can be increased. A variable speed-up capacitor C113 can be realized by arranging a plurality of capacitors and connecting them with conductive wires.

Figure 17:
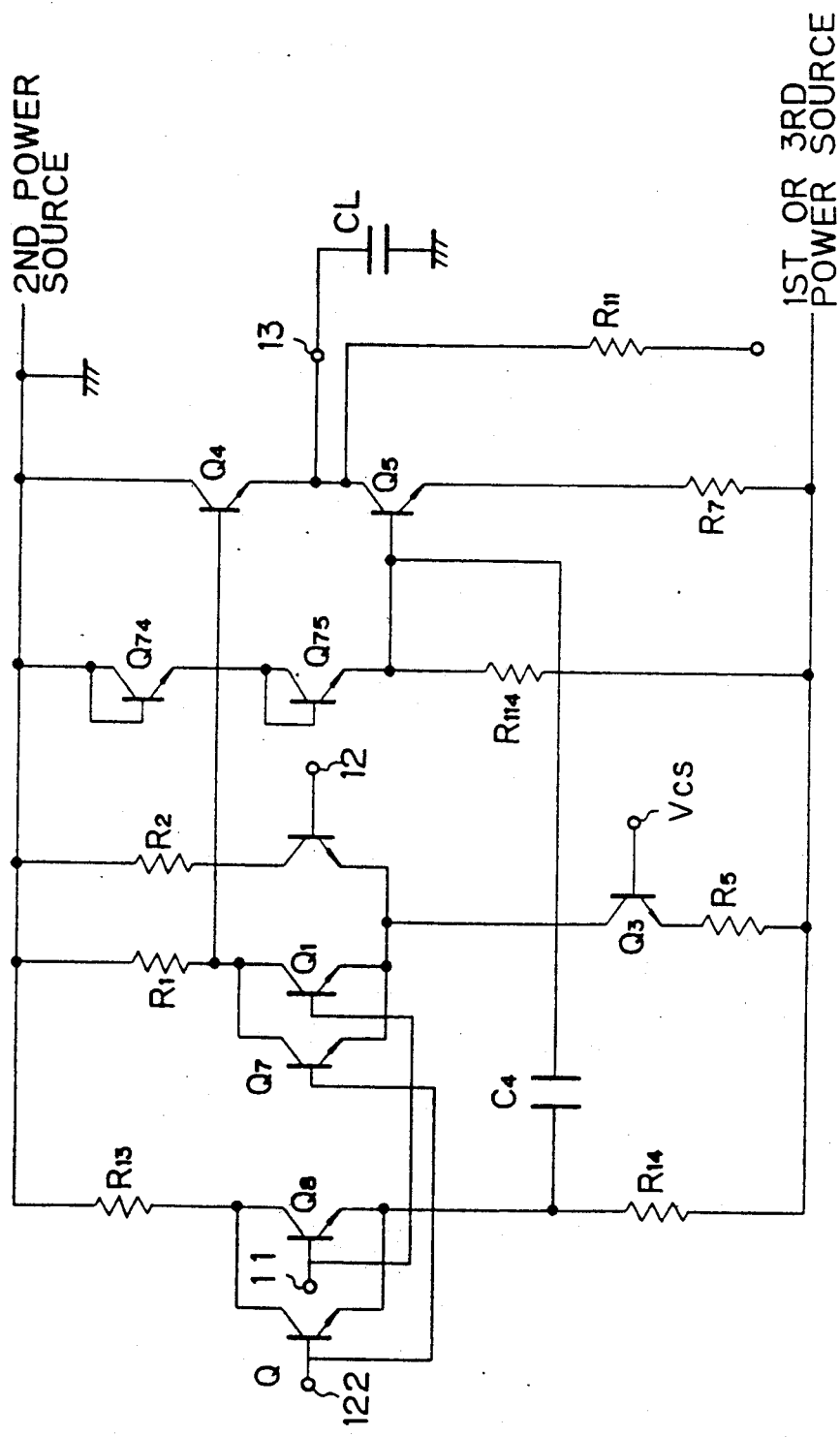

FIG. 17 shows another embodiment of the control voltage generating circuit according to the present invention. A circuit for two inputs with the NOR side being used for active pull-down is shown.

The collector and emitter of a transistor Q121 are commonly connected to the collector and emitter of the input side transistor Q1 of the ECL circuit, and its base is connected to another input terminal 122. The base of Q1 is connected to the input terminal 11 and the base of Q8.

As in the previous embodiment, the input terminals 122 and 11 are connected to the bases of transistors Q128 and Q8 respectively, with their collectors connected to the second power source and their emitters to the first or third power sources via resistor R14.

For a circuit with three or more inputs, the input terminals can be increased accordingly in the same manner.

This circuit operates in such a manner that when any one of the plural input signals is changed from the L level to the H level, one of the input transistors Q121 and Q1 of the ECL circuit where the signal is input turns on and the output terminal 13 changes from the H level to the L level.

At the same time, one of the transistors Q128 and Q8 where the signal is input turns on, and a pulse is generated by the circuit comprising the capacitors C4 and resistor R124, to turn on the pull-down transistor Q5.

Figure 18:
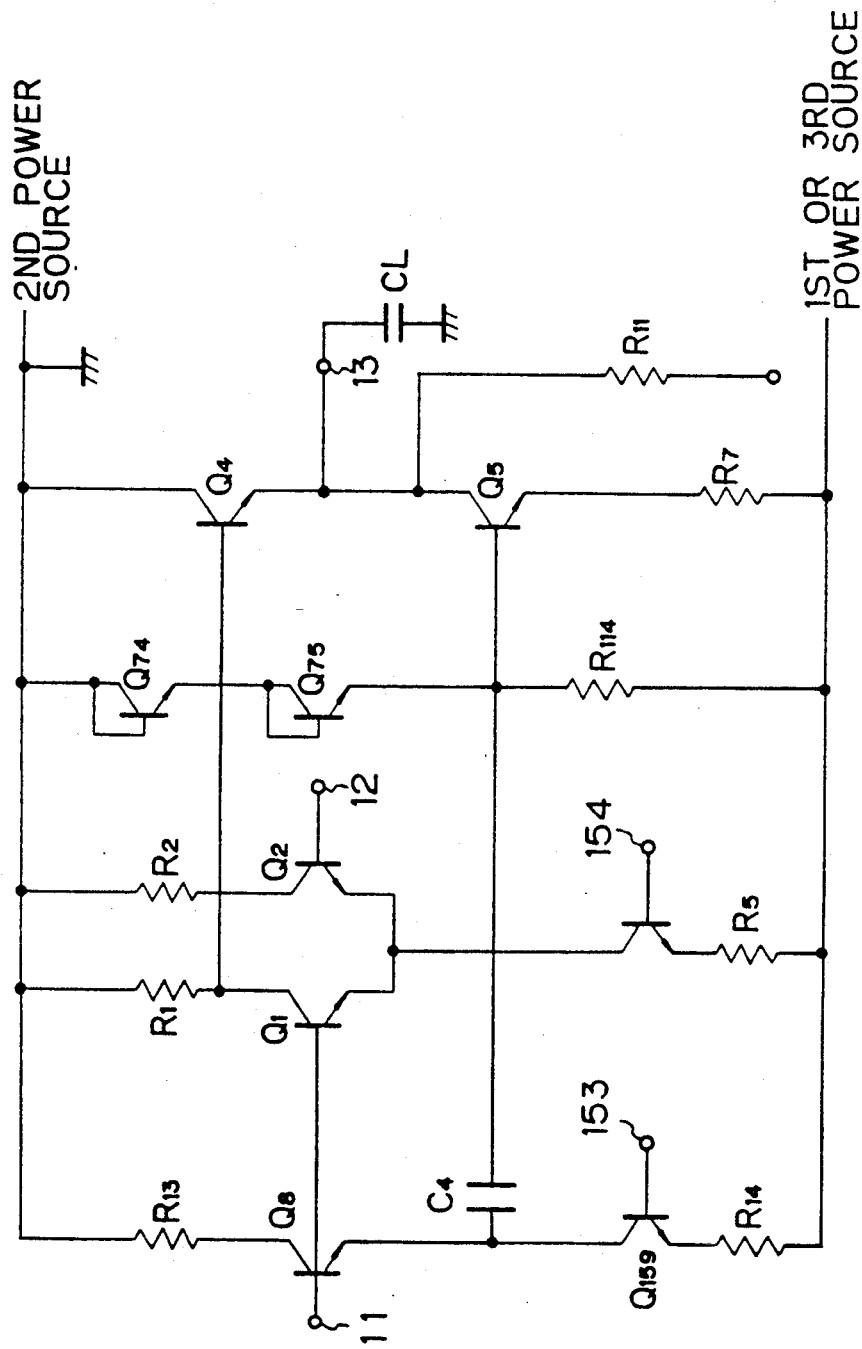

FIG. 18 shows another embodiment of the control voltage generating circuit according to the present invention. The simple resistor at the emitter side of transistor Q8 of the circuit where the pulse is taken out is replaced with a constant current source consisting of a transistor Q159 and resistor R14. A voltage is applied to a terminal 153 so that the transistor Q159 is turned on. The voltage applied to this terminal 153 may be the same as the voltage applied to a terminal 154 (Vcs).

Thus by using the transistor Q159 as a constant current source, the current flowing through the resistor R14 can be kept constant, so that the voltage applied to the capacitor C4 can be stabilized against changes in the power source voltage, and the amplitude of the generated current can be fixed.

Incidentally the circuit according to this embodiment is effective when the output is at the NOR side only.

Figure 19:
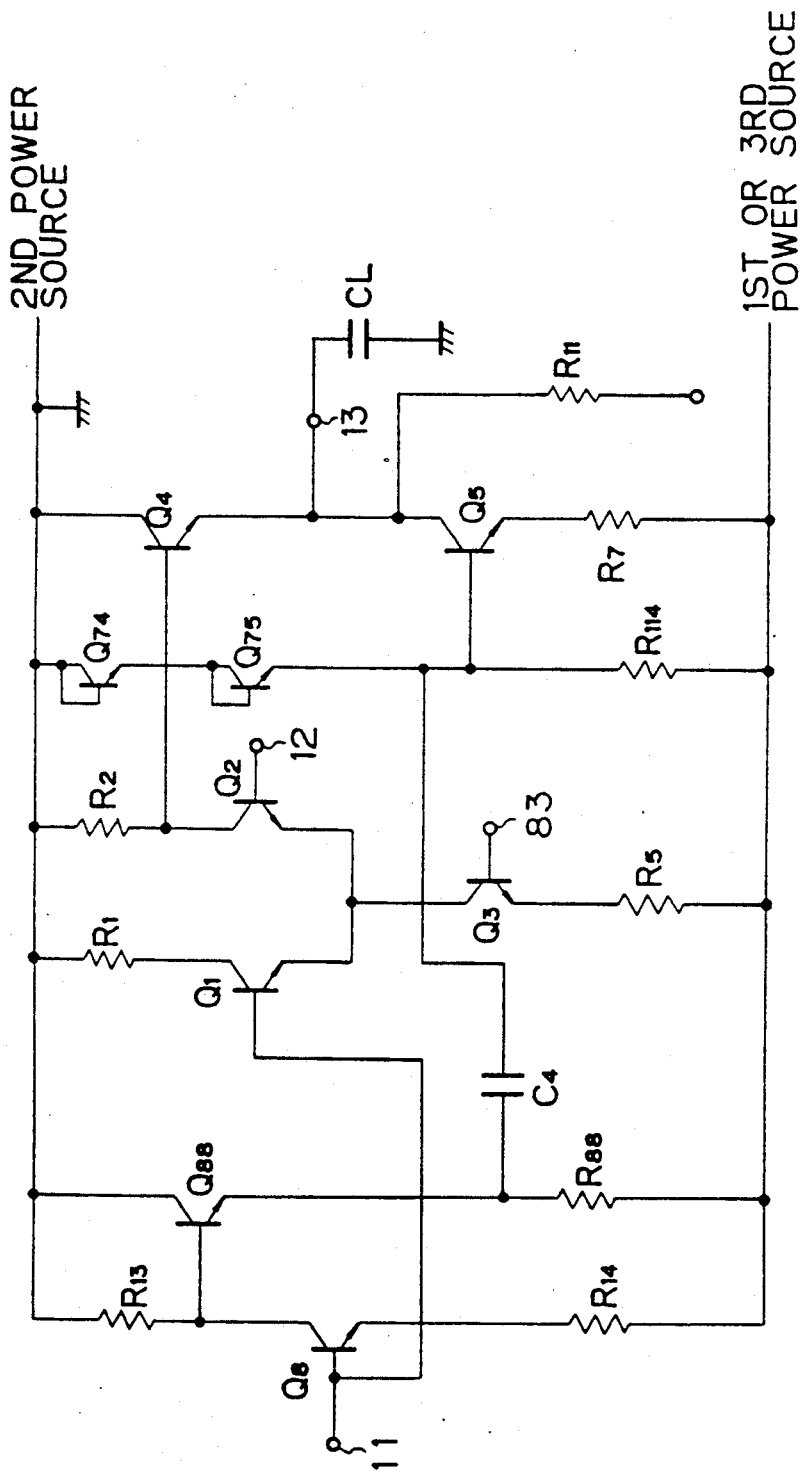

FIG. 19 shows another embodiment of the control voltage generating circuit according to the present invention. In this embodiment, an additional emitter-follower transistor Q88 and resistor R88 are added to the input circuit section consisting of R13, Q8, and R14 as mentioned above.

By this addition, the voltage changes of input signals in the transistor Q8 of the first-stage input circuit can further be amplified by the transistor Q88 of the second-stage input circuit, so as to reliably turn on the pull-down transistor Q5.

Figure 20:
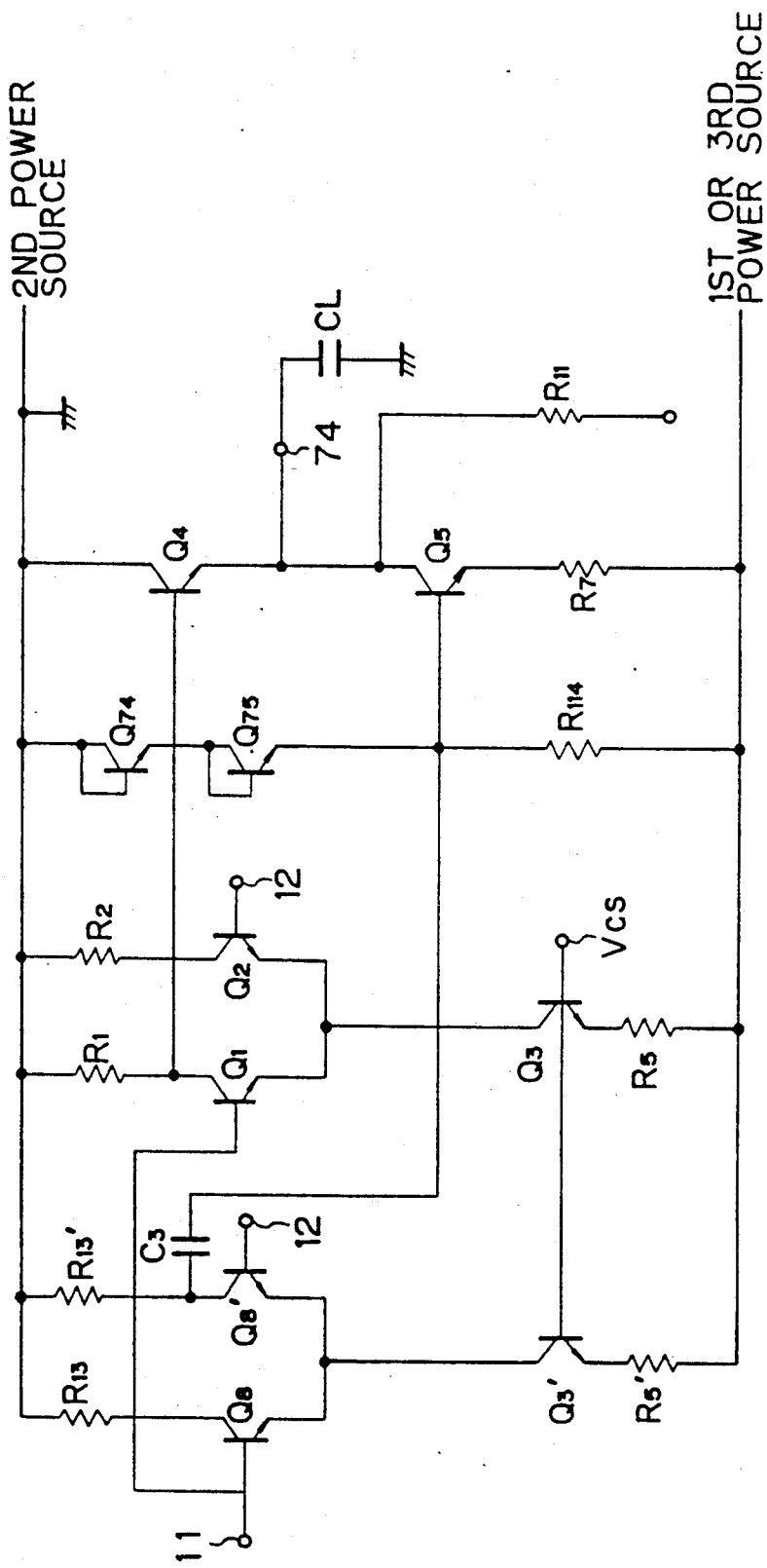

FIG. 20 shows a different embodiment of the control voltage generating circuit according to this invention, in which the input circuit in each of the above-mentioned embodiments was modified to have the same circuit construction with the ECL logic circuit. In FIG. 20, the input circuit construction is the same ECL circuit construction comprising transistors Q1 and Q2, and has a current switch circuit comprised of transistors Q8 and Q8', resistors R13 and R13'.

The constant current source of the ECL circuit at the input circuit side is comprised of transistor Q3' and resistor R5', and the base of transistor Q3' is so made to have the same level as the constant current source Vcs of the ECL circuit.

In FIG. 20, input signals are input to the base of the transistor Q8 of the input circuit via input terminal 11, and are also applied to the base of Q1 of another ECL circuit. Both the ECL circuits operate as ordinary ECL circuits.

If the input signals applied to the input terminal 11 change from the L level to the H level and exceed the threshold voltage value (terminal 12, Vref) of the ECL circuit in the input circuit, the voltage at the collector side of transistor Q8' also changes from the L level to the H level and a positive pulse is generated by the differential circuit comprised of the capacitor C3 and resistor R114.

The subsequent operations are the same as in the embodiments mentioned previously.

In the above embodiment, the collector of transistor Q8' and the base of pull-down transistor Q5 at the NOR side output circuit are connected to each other via a capacitor, but the collector of transistor Q8 may instead be connected to the base of pull-down transistor Q7 in the OR side output circuit section via a capacitor. Further, both connections can simultaneously be made.

Incidentally, in the above-mentioned embodiments, the construction is shown in which transistors Q74 and Q75 for supplying the pull-down transistor Q5 with DC bias are connected in series with the base of transistor Q5, but these transistors Q74 and Q75 may be removed and the pull-down transistor Q5 may be driven without using DC bias.

By so doing, the space for Q74 and Q75 can be reduced on the device surface. In this case, however, no DC bias is applied and the speed of pull-down transistor Q5 is reduced.

Therefore this embodiment can be used when reducing the required space on the device surface is more important than the circuit operation speed.

According to the embodiment explained above, no capacitor is attached to the collectors of transistors Q1 and Q2 of the ECL logic section 2, so the circuit operation can be further accelerated, further enhancing the effects of the above embodiments.

In this embodiment, the inverse phase of input signals is obtained by using the emitter and collector outputs of transistor Q8.

Figure 8:
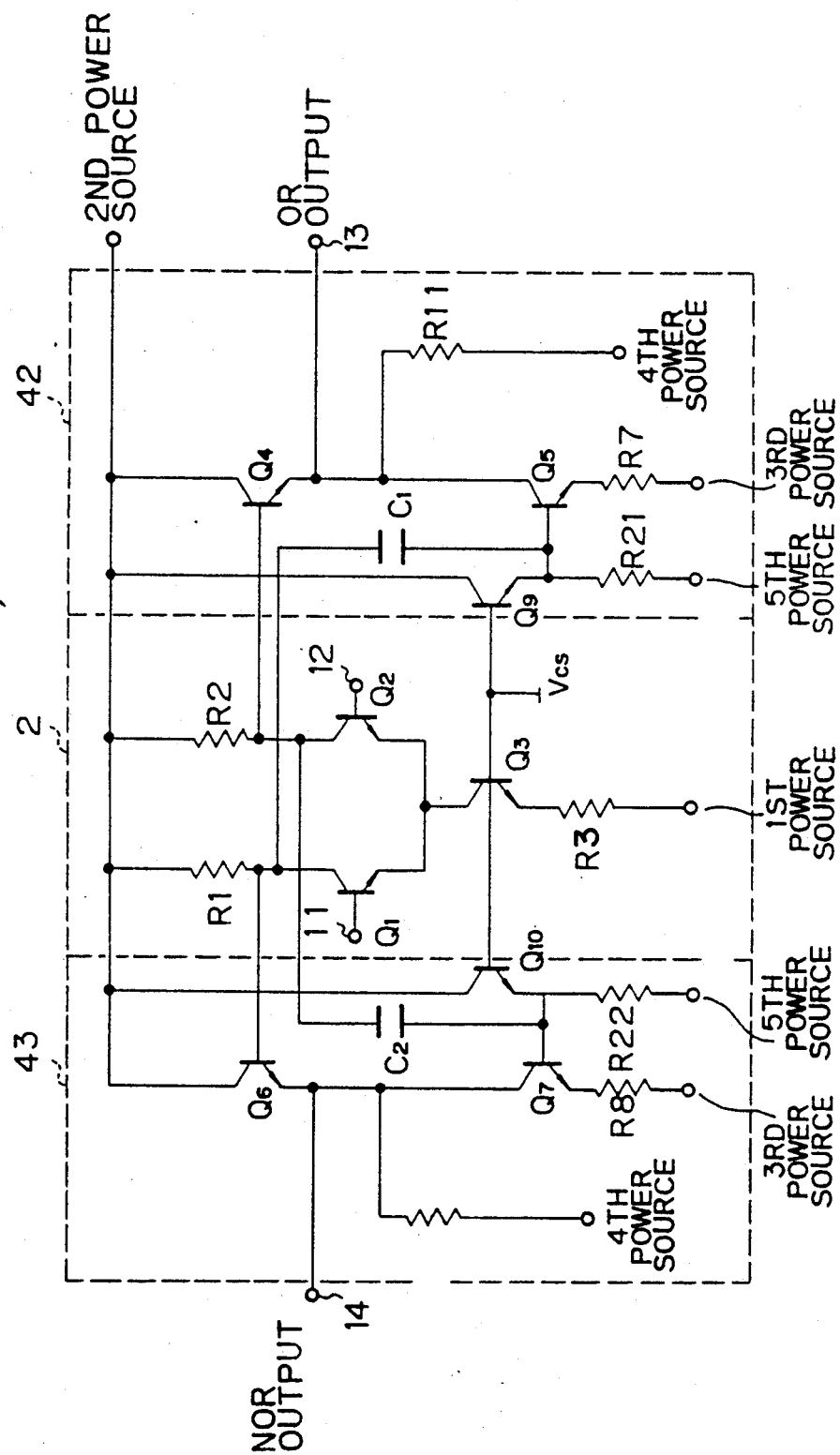
FIG. 8 is a circuit diagram of the third embodiment of a logic output circuit according to the present invention.

FIG. 8 shows the third embodiment of the ECL logic output circuit according to the present invention. The same reference numerals are given to the same components as in the first embodiment in FIG. 3, and the explanation of identical parts is omitted.

In FIG. 8, numeral 41 denotes an active pull-down ECL circuit, which has the same circuit construction as the aforesaid active pull-down ECL logic circuit 31 except for NPN transistors Q9 and Q10, the bases of which connected to a bias voltage terminal for a constant current source (not shown), provided between the second power source (GND) and the first power source ($V_{EE1}$), to keep their voltage level constant relative to the first power source $V_{EE1}$, and resistors R21 and R22 connected to the emitters of NPN transistors Q9 and Q10. Numerals 42 and 43 are emitter-follower circuits in the ECL logic circuit 41.

Therefore even if a voltage pulse is applied to the pull-down transistors Q5 and Q7 by these transistors Q9 and Q10, the Q3 base potential does not change, keeping the ECL logic section 2 stable.

As a result, this embodiment can further enhance the effects of the first embodiment.

According to the present invention, the logic circuit can actively lower its output voltage level while preventing an increase in power consumption, thus contributing to increased operation speed and high integration of the circuit.

The embodiments mentioned above are intended to discharge the electric charges on a load by driving pull-down transistors by external pulses and/or connecting them via capacitors to make them transiently conductive for any discharge. Other embodiments of a logic output circuit for realizing this technical idea will be explained below.

Figure 9:
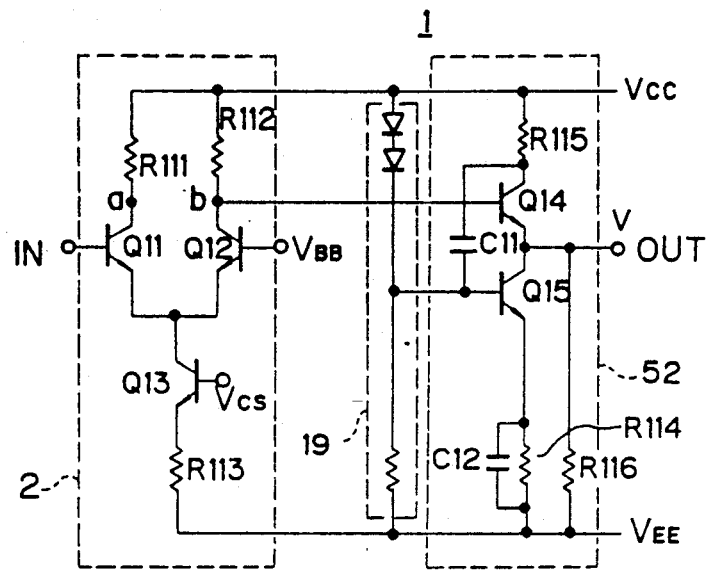
FIG. 9 is a circuit diagram of the fourth embodiment of a logic output circuit according to the present invention.

FIG. 9 shows another embodiment of a logic output circuit according to the present invention, the basic construction of which comprises a logic circuit 2 containing an emitter-coupled transistor which is composed of first and second transistors the collectors of which are both connected to the second power source, and the emitters of which are commonly connected to the constant current source connected to the first power source, an input signal in the same or inverse phase of input signals taken out from each one of collectors of different transistors; an emitter-follower transistor, the base of which is connected to the collector of at least one transistor of the logic circuit, the collector of which is preferably connected to the second power via a first resistor R15, and the emitter of which is connected to the output terminal; and a pull-down transistor, the collector of which is connected to the emitter of the emitter-follower transistor and the emitter of which is connected to the third power source.

The logic output circuit has a second resistor provided between the output terminal and the third power source, and a capacitor for connecting the collector of the emitter-follower transistor to the base of the pull-down transistor.

More detailed explanations are given below.

In FIG. 9, the logic circuit 2 has a differential circuit formed by two transistors Q11 and Q12, and resistors R111 and R112 connected to a high potential power source Vcc (a second power source), and the emitters of transistors Q11 and Q12 are connected to a low potential power source $V_{EE}$ (a first power source through a resistor R113). In the above construction, the base of transistor Q11 is used as the input IN and the base of the other transistor Q12 receives a reference voltage $VB_{BB}$.

The collector a of transistor Q11 is a NOR output, and the collector b of transistor Q12 is an OR output.

In this embodiment, there is shown an example of the construction where said OR output is generated from Vout by means of the output circuit 52.

The output circuit 52 according to this embodiment uses an emitter-follower transistor (the first transistor Q14) and the pull-down transistor (the second transistor Q15), the collector of the first transistor Q14 being connected to the high potential power source Vcc via a first resistor R115, and the emitter of the second transistor Q15 being connected to the low potential power source VEE via, for example, the resistor R14 and speed-up capacitor C12. The output from the OR output b of the logic circuit is input to the base of the first transistor Q14, and an appropriate bias circuit 19 is connected to the base of the second transistor Q15.

The emitter of the first and second transistors Q14 is connected to the output part Vout, and the second resistor R116 is connected between the output Vout and a low potential power source $V_{EE}$.

A coupling capacitor C11 is provided between the collector of the first transistor Q14 and the base of the second transistor Q15.

In this circuit, the total current i3 summed with i1 and i2 (i3=i1+i2) flows through the first transistor Q14 and the first resistor R115.

Note, that i1 is a current defined by a base voltage of the second transistor Q15, the base-emitter voltage $V_{BE}$ of the second transistor Q15 and the resistor R114 and i2 is a current i2 defined by the output Vout and the second resistor R116.

In other words, the first and second transistors Q14 and Q15 are on irrespective of the voltage input to their bases. If the input to the logic circuit 2 changes from "H" to "L", the signal output from OR output b of the logic circuit 2 changes from "H" to "L" and the emitter output of the first transistor Q14, i.e., Vout, changes from "H" to "L", and therefore the voltage between Vout and $V_{EE}$ reduced. Accordingly the current i2 flowing through the second resistor R116 reduces, and the current i3 flowing through the resistor R15 and transistor Q14 also reduces, increasing the collector voltage of the first transistor Q14.

Therefore, as a result of a positive pulse being instantaneously applied to the second transistor Q15 via the coupling capacitor C11, the second transistor Q15 conducts and its impedance becomes less than the impedance of the second resistor R116, instantaneously allowaning a large current to flow, so that any electrical charges in the capacitance of a wiring load, etc. (not shown) connected to the output Vout can rapidly be discharged.

Namely, a waveform inversed in phase to the output from the logic circuit b appears at the base of the second transistor Q15.

On the contrary, when the input signal changes from "L" to "H", the output "H" from the logic circuit part b is applied to the base of first transistor Q14, so the emitter output from the first transistor Q14, i.e., the voltage Vout, increases. As a result, the current flowing through the second resistor R116 increases, increasing the current i3 flowing through the first resistor R115 and the first transistor Q14, reducing the collector voltage of the first transistor Q14.

Therefore a negative pulse, in contrast to the previous case, is applied to the base of the second transistor Q15 via capacitor C11, and the second transistor Q15 momentarily stops conducting. As a result, electrical charges build up in the capacitance of a wiring load, etc;

connected to the output Vout, from a high potential power source Vcc via the first resistor R115 and the first transistor Q14.

As can be seen from the above explanation, in this case also, a waveform inversed in phase to the output of the output part b of the logic circuit is input to the base of the second transistor Q15.

According to the present invention, it is possible to use a pull-down circuit composed of the first resistor R115, the second resistor R116, and the first transistor Q14 to form the necessary inverse-phase waveform from either the OR or NOR output of the logic circuit through an emitter-follower output circuit.

Also according to the present invention, the above inverse-phase waveform is obtained by generating a potential corresponding to the current i2 at the collector of the first transistor Q14 by allowing the current i2 corresponding to the potential between the output part Vout and $V_{EE}$ through the second resistor R116 provided between the output Vout and a low potential power source VEE.

In the above embodiment, the resistor R114 and capacitor C12 connected to the emitter of the second transistor Q15 may be omitted.

The above embodiment is an example of the output being obtained from the OR output b of the logic circuit, but the same effects can be produced by obtaining the output from the NOR output a.

Further, the output may be simultaneously obtained from both the NOR output a and the OR output b.

Figure 10:
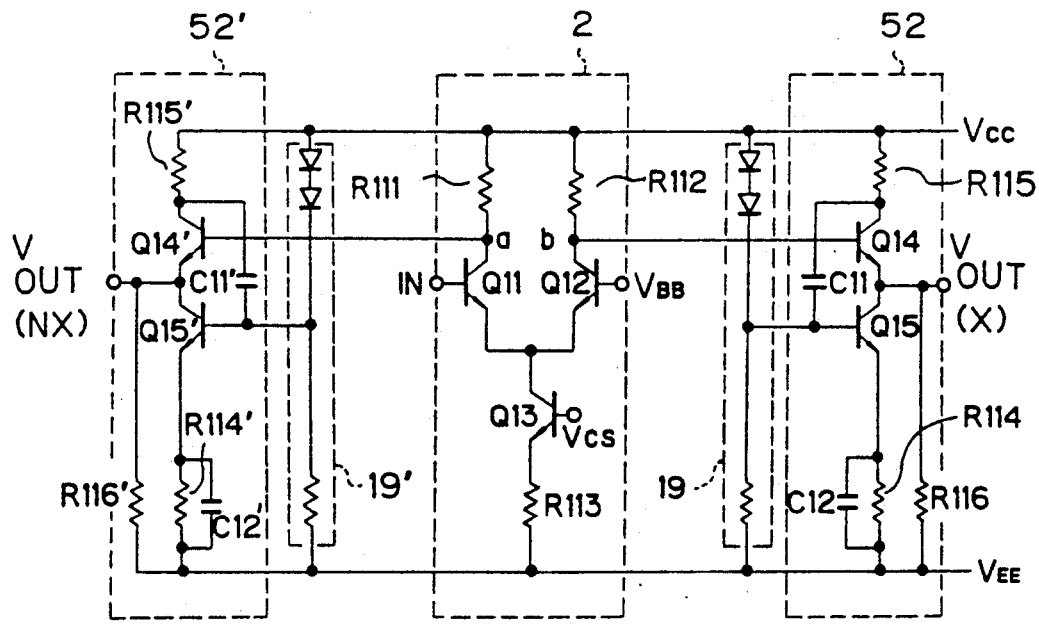
FIG. 10 is a circuit diagram of the fifth embodiment of a logic output circuit according to the present invention.

FIG. 10 shows another embodiment in which the output is obtained from both the OR output b and NOR output a of the logic circuit 2.

FIG. 10 shows the same output circuit 51' as in FIG. 9 which is provided in symmetry with the NOR output a and OR output b of the logic circuit part 2, in which the same reference numbers or symbols marked with ' are used for the same components as in FIG. 9.

Figure 11:
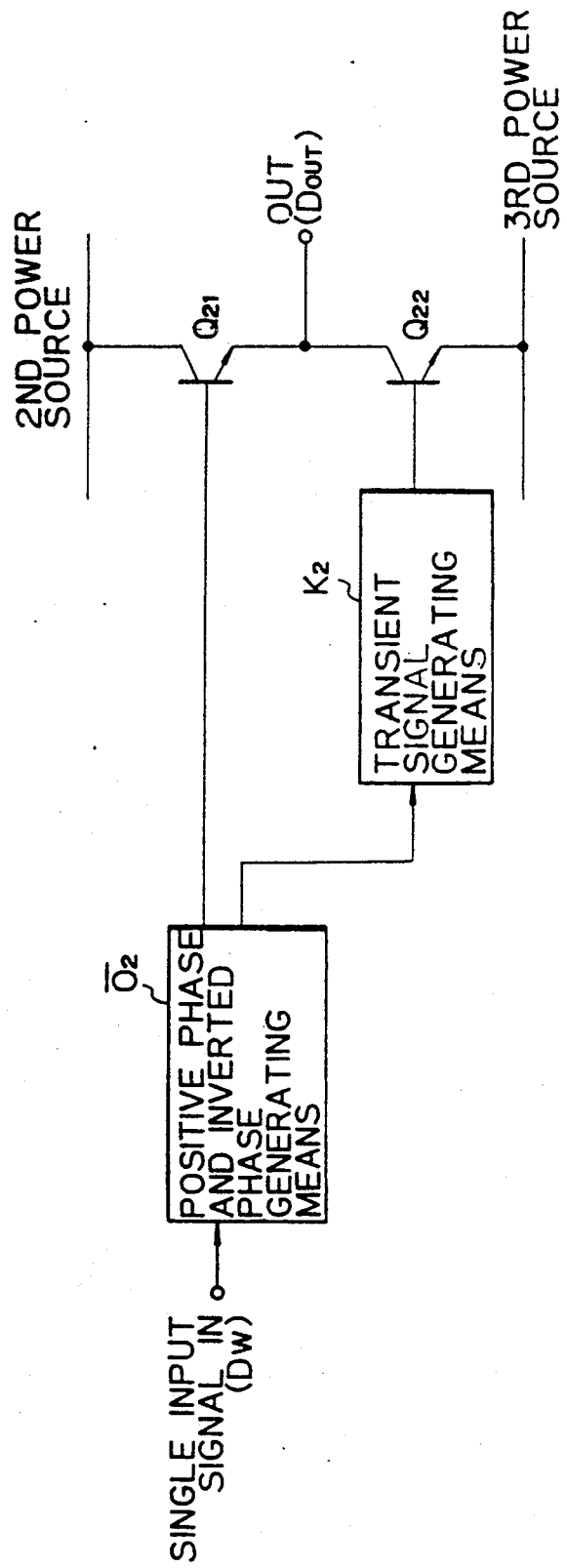
FIG. 11 is a diagram showing the principle of the sixth embodiment of a logic output circuit according to the present invention.

FIG. 11 shows the principle of another embodiment of the logic output circuit according to the present invention, wherein an output circuit 62 is connected to the logic circuit 2, the first transistor (emitter follower transistor) Q21 and the second transistor (pull-down transistor) Q22 are connected in series between the high potential power source (the second powersource) and low potential power source (the third power source) with the middle point of said series connection used as the output terminal, said output circuit 62 comprising the regular- and inverse-phase signals generating means 02 connected in parallel with the first and second transistors between a high and low potential power sources and generating regular- and inverse-phase signals based on the single input signal output from said logic circuit part 2; and a transient signal generating means $K_2$ for generating large transient current signals at the rise time of the inverse-phase signals and transient cut-off signals at the fall time of the inverse signals, the output circuit 62 driving and controlling the series connected first transistor (emitter-follower transistor Q21) based on the regular-phase signals and driving and controlling the second transistor (pull-down transistor Q22) based on the large transient current signal and the transient cut-off signals.

In this way, the regular- and inverse-phase signals can easily be generated independently of each other without relying upon the circuit construction on the input signal generation side.

Particularly when producing both outputs OR/NOR, AND/NAND, etc, simultaneously, each transient signal generation means does not affect the other's potential changes, thus maintaining a high speed of switching operation.

In other words, a circuit consisting of the regular- and inverse-phase signal generating means and the transient signals generating means in this embodiment corresponds to the control voltage output circuit in the previous embodiment (FIG. 7).

The above embodiment according to the present invention will hereinafter be explained with reference to FIG. 12 which shows the circuit diagram of this embodiment.

The output circuit part 2 of the ECL circuit shown as an example of the logic circuit according to the present invention includes output circuits 62 and 63 connected to the logic circuit part 2.

Either of the differential outputs of the logic circuit part 2 is input as a control signal, based on which the first transistors (emitter-follower transistors) Q21 and Q31 and the second transistors (pull-up transistors) Q22 and Q32 are driven and controlled, and by driving said first and second transistors Q21, Q31, Q22 and Q32, data (output signals) are output to a load from the output terminal Dout.

The output circuits 62 and 63 consist of inverse-phase signal generating circuits O2 and O3, including transistor Q23, for generating inverse signals based on the differential output input from the logic circuit part 2; transient signal generating means K2 and K3 comprising capacitors C21 and C1, and resistors R24 and R34 for generating a large transient current signal Tt at the rise time of the inverse-phase signal Tn and a transient shut-off signal Tb at the fall time of the inverse-phase signal Tn; bias circuits B2 and B3 for applying a certain bias voltage to the second transistor Q22 and Q32; and output step circuits D2 and D3 for sending data from an output terminal $D_{OUT}$ based on an input signal Tin from said logic circuit.

Namely in this embodiment, another control transistor Q23 is provided between first and second power sources, and its base is connected to the collector of one transistor Q12 and Q11 of the logic output circuit, and the collectors of the control transistor Q23 and Q33 are connected to the transistor Q32 via capacitors C21 and C31.

Next, the operation of a circuit having the above construction will be explained referring to FIG. 13. The output circuit 62 forming this circuit operates as an OR circuit, and the output circuit 63 operates as a NOR circuit.

First, the input data are input to the input terminal D in of the logic circuit part 2, and the input signal Tin corresponding to this input data (see FIG. 13) is input to the output circuit 62 from the collector of transistor Q12.

Further an input signal (not shown) inversed in phase to said input signal Tin is input to the output circuit 63 from the collector of transistor Q11 of logic circuit part 2.

The operation of the output circuit 62 will be explained below.

Figure 13:
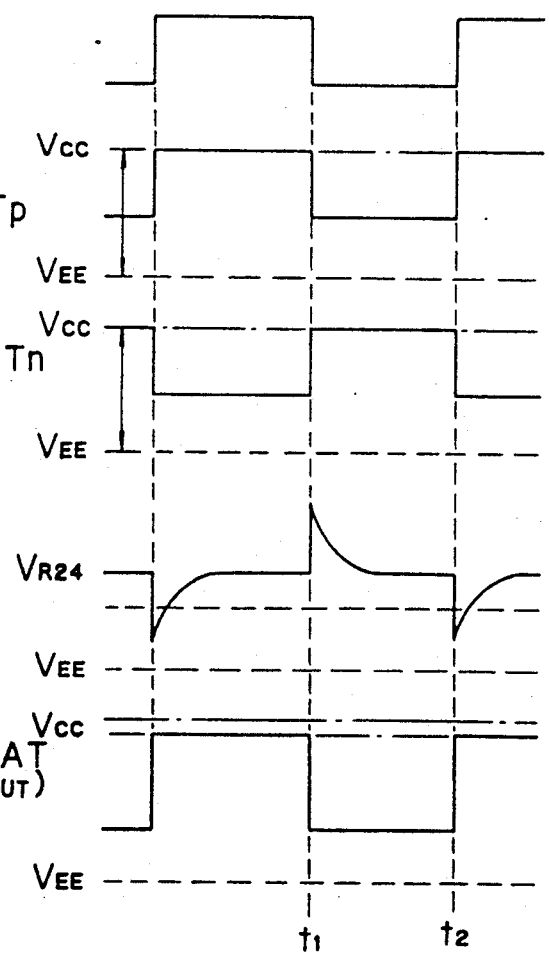
FIG. 13 shows the waveform of each input signal in the embodiment shown in FIG. 12, FIGS. 14 and 15 show the circuit construction of the seventh embodiment according to the present invention.

In the above output circuit 62, the input signal Tin (see the waveform (9) in FIG. 13) is applied to the bases of transistors Q23 and Q21 to generate the signal Tn (see the waveform (C) in FIG. 13) inversed in phase to the waveform of the input signal Tin in the inverse-phase signal generating circuit O2 including the transistor Q23.

The inverse-phase signal Tn is applied to the capacitor C21, and the large transient current signal Tt is generated at the rise time of the inverse-phase signal Tn and the transient cut-off signal Tb is generated at the fall time of the inverse-phase signal Tn in the differential circuit composed of the capacitor C21 and resistor R24.

On the other hand, the transistor Q21 to which the input signal Tin is input outputs a signal Dout from its emitter in response to the regular-phase signal Tp of the input signal Tin (see the waveform (b) in FIG. 13).

In the output signal output from the emitter of this transistor Q21, a certain voltage VR24 (voltage drop of the resistor R24) usually output from the bias circuit B2 is applied to the base of transistor Q22, and a constant current determined by this applied voltage flows through the transistors Q21 and Q22.

When the input signal Tin changes from the "H" to the "L" level (time t1 in FIG. 3), the inverse-phase signal Tn at the end of resistor R22 changes from "L" to "H" level.

At the rise time of this inverse-phase signal Tn, the transient large current signal Tt is generated by the differential circuit consisting of the capacitor C21 and resistor R24 (see FIG. 13).

This large transient current signal Tt is supplied to the base of transistor Q22 in the output step circuit D2, and transistor Q22 rapidly discharges the electric charges accumulated in the load connected to the output terminal Dout.

On the contrary, when the input signal Tin changes from "L" to "H" level (time t2 in FIG. 13), the inverse-phase signal Tn changes from "H" to "L" level. At the fall time of this inverse-phase signal Tn, the transient cut-off signal Tb is generated by the differential circuit consisting of capacitor C21 and resistor R24 (see FIG. 13).

This transient shut-off signal Tb is supplied to the base of transistor Q22, which then cuts off, and the output signals are rapidly supplied from the output terminal Dout to the load through the transistor Q21.

Like the output circuit 62, the output circuit 63 also operates based on signals from the logic circuit part 2.

Next, the use of both OR and NOR outputs simultaneously to send signals to the output circuits 62 and 63 from the logic circuit will be explained referring to FIGS. 12 and 13.

First, when the input signal Din is input to the logic circuit part 2, a signal in the same phase as this input signal is output to the output circuit 62, while a signal inverse in phase to the input signal Din is output to the output circuit 63.

The output circuit 62 generates an inverse-phase signal Tn in the inverse-phase signal generating circuit O2 based on the signal in the same phase as the input signal Din.

This inverse-phase signal Tn is input to the capacitor C21, and a regular-phase signal Tp in the same phase as the input signal Din is supplied as the base current to the transistor Q21 of the output step circuit D2.

The output circuit 63 generates the inverse-phase signal Tn (inversed in phase to the input signal to the output circuit 63) in the inverse-phase signal generating circuit O3 based on the signal inversed in phase to the input signal Din, and this inverse-phase signal Tn is input to the capacitor C31 and the regular-phase signal Tp inversed in phase to the input signal Din is supplied as the base current to the transistor Q31 of the output step circuit D3.

Namely in the inverse-phase signal generating circuits O2 and O3 in the output circuits 62 and 63, the regular-phase signal Tp in the same phase as the input signal Tin to drive and control the transistors Q21 and Q31 of output step circuits D2 and D3, and the inverse-phase signal Tn to be input to the capacitors C21 and C31 to drive and control the transistors Q22 and Q32 can be generated independently of each other without affecting the mutual switching operation.

Even if OR and NOR outputs are simultaneously sent from the logic circuit 1 to the output circuits 62 and 63, they do not reduce the operation speed of the logic circuit 2.

Figure 14:
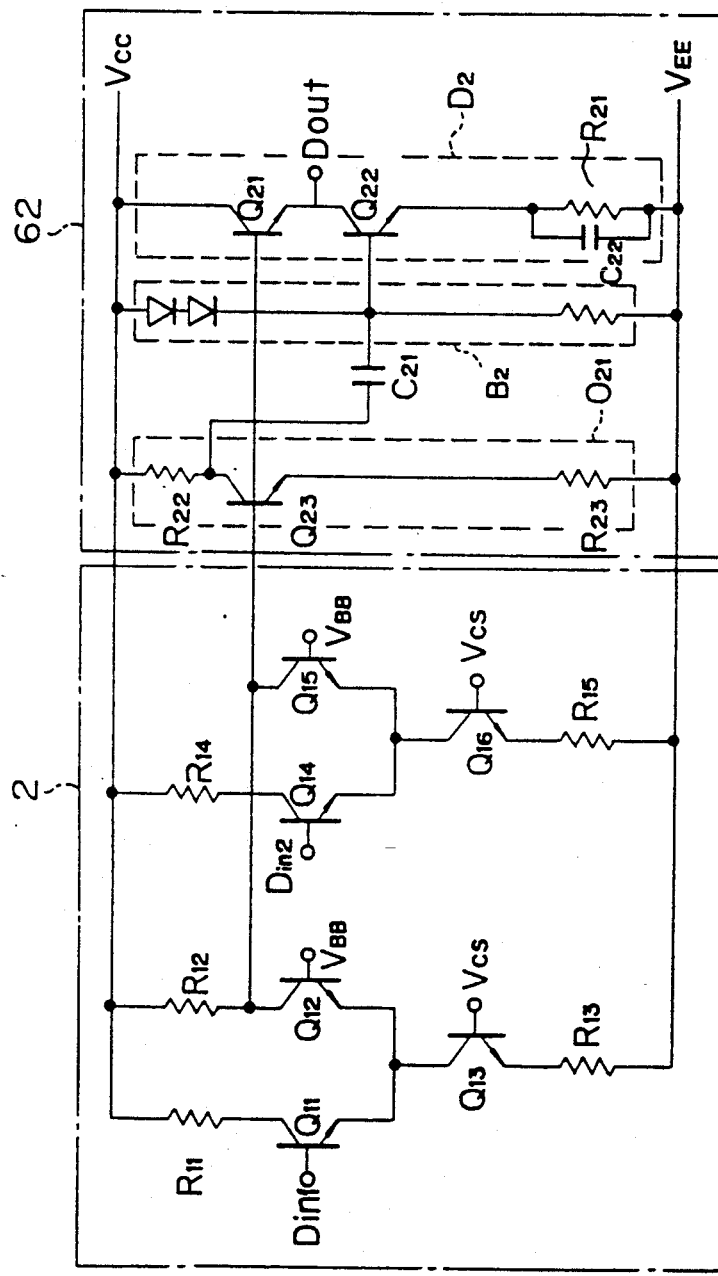

FIG. 14 shows the circuit construction of another embodiment according to the present invention, in which the logic circuit part 2 sending the control signals to the output circuit 62 is constructed with the collector dotted gate with a multi-input structure.

In this structure, the outputs of both regular-and inverse-phase signals can be generated by the inverse-phase generating circuit O2 of the output circuit 62 with a simple circuit construction.

Figure 12:
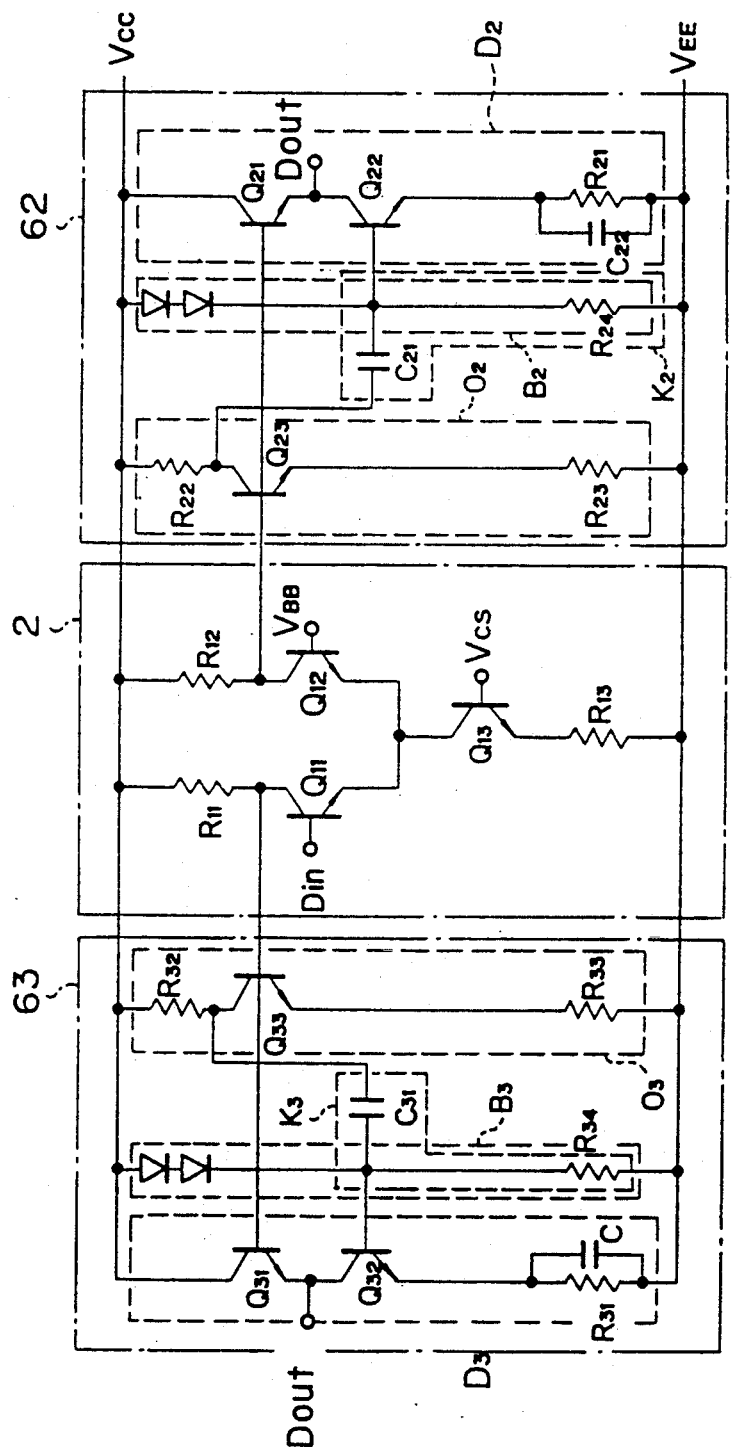
FIG. 12 is a circuit diagram showing a concrete circuit construction realizing the principle shown in FIG. 11.
Figure 15:
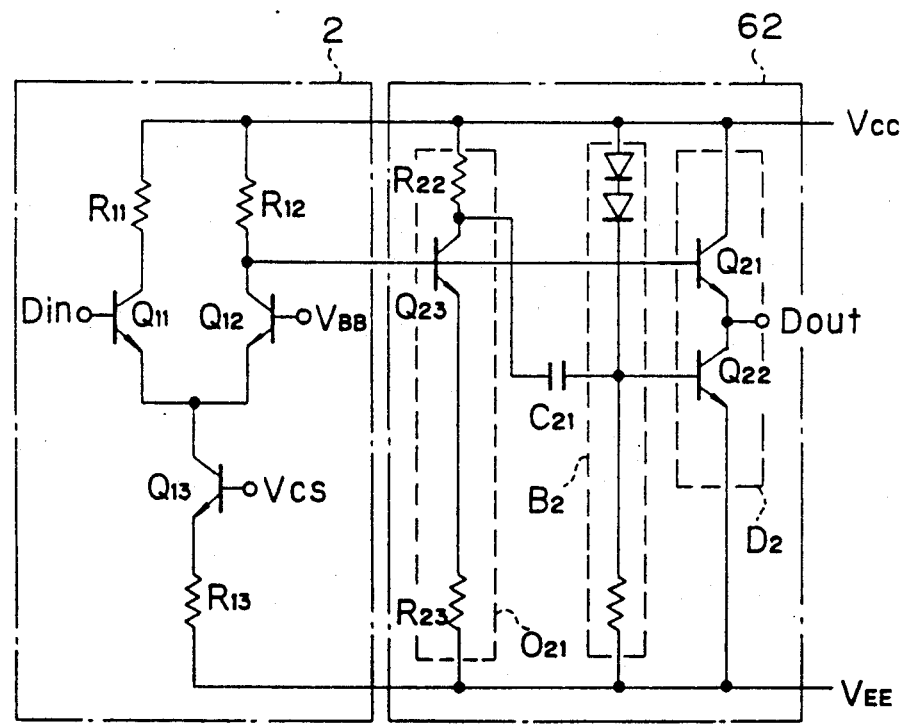

FIG. 15 shows the circuit construction of still another embodiment according to the present invention, in which the output step circuit D2 in the output circuit 62 is constructed without using the resistor R21 and capacitor C22, as in the embodiment shown in FIG. 12.

Thus even if these elements are omitted, the same effects can be produced as in the embodiments mentioned previously.

When an LST circuit is formed, the number of elements used can be reduced.

We claim:

1. A logic circuit coupled to first, second, third and fourth power sources, and receiving a first input signal, one of a second input signal having an inverse phase to said first input signal and a reference signal, and a pulse, and having an output terminal, comprising:

a logic circuit section including
emitter-coupled transistors constructed with first and second transistors, having collectors which are coupled to the second power source, and
a constant current source coupled to the first power source and the emitter-coupled transistors,
a first base of said first transistor being coupled to receive the first input signal, and a second base of said second transistor being coupled to receive one of the second input signal and the reference signal, and output signals similar to and inverse to one of said first and second input signals, respectively, being derived from the collectors of said first and second transistors; and an output circuit section including
an emitter-follower transistor having a base which is coupled to one of the collectors of said first and second transistors of said logic circuit section, a collector which is coupled to the second power source, and an emitter which is coupled to the output terminal of said logic circuit;
a pull-down transistor having a collector which is coupled to the emitter of said emitter-follower transistor, and having an emitter which is coupled to the third power source,
a control voltage terminal connected to the base of said pull-down transistor, the pulse having a voltage level higher than a threshold voltage of said pull-down transistor being input to said control voltage terminal at a moment when a logic level at said output terminal is changed from a high potential to a low potential; and a first resistor inserted between said emitter-follower transistor and the fourth power source.

2. The logic circuit according to claim 1, wherein output signals having a similar phase as one of said first and second input signals are derived from the collector of the second transistor.

3. The logic circuit according to claim 1, wherein output signals in inverse phase to one of said first and second input signals are derived from the collector of the first transistor.

4. The logic circuit according to claim 1, wherein said logic circuit has at least two kinds of logic outputs.

5. The logic circuit according to claim 1, wherein a plurality of input terminals are provided.

6. The logic circuit according to claim 1, wherein said constant current source includes
   a third transistor having a collector coupled to the emitters of the first and second transistors, an emitter coupled to said first power source, and a base coupled to a constant potential, and
   a second resistor coupled between the emitter of the third transistor and the first power source.

7. The logic circuit according to claim 1, further comprising:
   a control voltage generating circuit coupled to said control voltage terminal, for generating a control voltage input to said control voltage terminal, and
   a third transistor coupled between one of the first and third power sources, and the second power source, a collector of said third transistor being coupled to the second power source, the emitter of said third transistor being coupled with the first power source, the base of said third transistor being coupled to the input terminal, and at least one of the collector and emitter of said third transistor being coupled to the base of the pull-down transistor of said output circuit part, and
   a first capacitor coupled between at least one of the collector and the emitter of said third transistor and the base of the pull-down transistor.

8. The logic circuit according to claim 7, wherein the collector of said third transistor is coupled to the base of the pull-down transistor of an OR side output circuit part, further comprising:
   a second capacitor coupled between the collector of said third transistor and the base of the pull-down transistor.

9. The logic circuit according to claim 7, wherein the emitter of said third transistor is coupled to the base of the pull-down transistor of a NOR side output circuit part, further comprising:
   a second capacitor coupled between the emitter of said third transistor and the base of the pull-down transistor.

10. The logic circuit according to claim 7, further comprising:
    a plurality of input terminals, one of which is connected to each base of said first and third transistors,
    a fourth transistor having a collector and emitter coupled to the collector and emitter of the first transistor, and
    a fifth transistor having a collector and emitter coupled to the collector and emitter of the third transistor, and bases of said fourth and fifth transistors being commonly coupled to one of the plurality of input terminals.

11. The logic circuit according to claim 7, wherein a constant current source includes a fourth transistor and a third resistor coupled between the emitter of said third transistor and one of the first and third power sources.

12. The logic circuit according to claim 7, further comprising:
    a fourth transistor provided between one of the first and third power sources and the second power source, having a collector coupled to the second power source, having an emitter coupled to one of the first and third power sources, and having a base coupled to the collector of the third transistor, at least one of the collector and emitter of said fourth transistor being coupled to the base of the pull-down transistor of the output circuit part; and
    a second capacitor coupled between at least one of the collector and emitter of the fourth transistor and the base of the pull-down transistor.

13. The logic circuit according to claim 7, further comprising:
    a fourth transistor coupled in parallel with said third transistor, the collector and emitter of said fourth transistor being coupled to the second power source and the emitter of said third transistor respectively to form a differential circuit, the base of said fourth transistor being coupled to the base of the second transistor of said logic circuit part, and the collector of one of said third transistor and said fourth transistor being coupled to the base of the pull-down transistor of said output circuit part; and
    a second capacitor coupled between the collector of one of said third transistor and said fourth transistor, and the base of the pull-down transistor.

14. The logic circuit according to claim 7, further comprising:
    an impedance coupled between the emitter of said third transistor and one of the first and third power sources, and
    a second capacitor coupled in parallel at both ends of said impedance.

15. The logic circuit according to claim 14, further comprising:
    plural additional impedances coupled at both ends of said impedance, and being connected in parallel according to a wiring load capacitor so that said wiring load capacitor is variable.

16. A logic circuit coupled to first, second, third and fourth power sources, and receiving a first input signal, one of a second input signal and a reference signal, and first and second pulses, and having a constant current source and first and second output terminals, comprising:
    an ECL logic part including
       first and second transistors, which receive the first input signal at a base of the first transistor and one of a second input signal and a reference signal at a base of the second transistor, output signals in similar phase as said input signals being generated in a collector of the second transistor, output signals in inverse phase to said input signals being generated in a collector of said first transistor, and a third transistor coupled to the first power source via the constant current source;

a first emitter-follower transistor having a base which is coupled to the collector of the second transistor of said ECL logic part, having a collector which is coupled to the second power source, and having an emitter which is coupled to the first output terminal;

a first pull-down transistor having a collector which is coupled to the emitter of said first emitter-follower transistor, and having an emitter which is coupled to the third power source;

a first control voltage terminal coupled to a base of said first pull-down transistor, the first pulse which is higher than a threshold voltage of said first pull-down transistor being input to said first control voltage terminal at a first moment when a logic level at said first output terminal is changed from a high potential to a low potential;

a first resistor inserted between said first emitter-follower transistor and the fourth power source;

a second emitter-follower transistor having a base which is coupled to the collector of the first transistor of said ECL logic part, having a collector which is coupled to the second power source and having an emitter which is coupled to the second output terminal;

a second pull-down transistor having a collector which is coupled to the emitter of said second emitter-follower transistor and having an emitter which is coupled to the third power source;

a second control voltage terminal coupled to a base of said second pull-down transistor, the second pulse which is higher than a threshold voltage of said second pull-down transistor being input to said second control voltage terminal at a second moment when a logic level at said second output terminal is changed from a high potential to a low potential; and a second resistor inserted between said second emitter-follower transistor and the fourth power source.

17. The logic circuit according to claim 1, further comprising:

a first capacitor coupled between the collector of the first transistor of the ECL logic part and the base of the second emitter-follower transistor; and a second capacitor coupled between the collector of the first transistor of the ECL logic part and the base of the first emitter-follower transistor.

18. The logic circuit according to claim 17, further comprising:

first and second level shift means for shifting a signal level output to the first and second control voltage terminals, respectively, wherein said logic circuit is coupled to a fifth power source, and wherein said first and second control voltage terminals are coupled to the first power source via the level shift means.

19. The logic circuit according to claim 18, wherein the constant current source includes a third transistor, and wherein the first level shift means includes a fourth transistor having a base coupled to a base of the third transistor, a collector coupled to said second power source, and an emitter coupled to the base of said first pull-down transistor.

20. The logic circuit according to claim 18, wherein the constant current source includes a third transistor, and wherein the second level shift means includes a fifth transistor having a base coupled to the base of the third transistor, a collector coupled to said second power source, and an emitter coupled to the base of said second pull-down transistor.

21. The logic circuit according to claim 18, wherein the constant current source includes a third transistor, and wherein the first level shift means includes a fourth transistor having a base coupled to the base of the third transistor, a collector coupled to said second power source, and an emitter coupled to the base of said first pull-down transistor, and wherein the second level shift means includes a fifth transistor having a base coupled to the base of said third transistor, a collector coupled to said second power source, and an emitter coupled to the base of said second pull-down transistor.

22. The logic circuit according to claim 18, further comprising:

a first capacitor coupled between said first control voltage terminal and the collector of said first transistor of the ECL logic part, and a second capacitor coupled between said second control voltage terminal and the collector of said second transistor of the ECL logic part, and wherein said first control voltage terminal is connected to the fifth power source via the first level shift means, and wherein said second control voltage terminal is connected to the fifth power source via the second level shift means.

23. The logic circuit according to claim 7, wherein the second power source is grounded.

24. The logic circuit according to claim 22, wherein said fifth power source has a potential identical to a potential of the third power source.

25. The circuit according to claim 16, wherein a potential between said second and fourth power sources is smaller than a potential between said second and third power sources.

26. The logic circuit according to claim 16, wherein a potential of the fourth power source is higher than a potential of the third power source and less than a potential of the second power source.

27. A logic circuit coupled to first, second and third power sources, and receiving a first input signal, one of a second input signal and a reference signal, and having an output terminal, comprising:

a logic circuit part including emitter-coupled transistors composed of first and second transistors, having collectors which are coupled to the second power source, and a constant current source coupled to the first power source and the emitter-coupled transistors, a first base of one of said first and second transistors being coupled to receive the first input signal, and a second base of one of said first and second transistors being coupled to receive one of a second input signal and a reference signal, and output signals in similar or inverse phase to one of said first and second input signals being obtained from the collectors of said first and second transistors; and an output circuit part including a first resistor;

an emitter-follower transistor having a base coupled to one of the collectors of said first and second transistors of said logic circuit part, having a collector coupled to the second power source via the first resistor, and having an emitter coupled to the output terminal, and a pull-down transistor having a collector coupled to the emitter of said emitter-follower transistor, and having an emitter coupled to the third power source, a second resistor coupled between said output terminal and said third power source, and a capacitor coupled between the collector of said emitter-follower transistor and the base of said pull-down transistor.

28. The logic circuit according to claim 27, wherein the emitter of said pull-down transistor is coupled to the third power source via a third resistor and a speed-up capacitor.

29. A logic circuit coupled to first, second and third power sources, and receiving a first input signal, one of a second input signal and a reference signal, and having an output terminal, comprising:

a logic circuit part including first and second transistors having collectors which are coupled to a second power source, and a constant current source coupled to the first power source and the first and second transistors, a first base of one of said first and second transistors being coupled to receive the first input signal and a second base of one of the first and second transistors being coupled to receive one of the second input signal and the reference signal, and output signals in the similar or inverse phase to one of said first and second input signals being obtained from the collectors of said first and second transistors;

an output circuit part including an emitter-follower transistor having a base coupled to the collector of one of said first and second transistors of said logic circuit part, a collector coupled to the second power source, and an emitter coupled to the output terminal, and a pull-down transistor having a collector coupled to the emitter of said emitter-follower transistor, and an emitter coupled to the third power source, and similar- and inverse-phase signal generating means coupled between said second and third power sources in parallel with said emitter-follower transistor and pull-down transistor, for generating positive and inverted phase signals in the similar- and inverse-phase, respectively; to one of said input signals simultaneously based on one of the output signals from said logic circuit part, for providing one of the emitter-follower transistor and the pull-down transistor with one of the positive and inverted phase signals, and for providing the other of the emitter-follower transistor and the pull-down transistor with the other of the positive and inverted phase signals; and transient signal generating means coupled to the pull-down transistor and said similar- and inverse-phase generating means, for generating transient signals at a time when said similar- and inverse-phase signal changes, and for outputting the transient signals to the pull-down transistor.

30. The logic circuit according to claim 29, wherein said similar- and inverse-phase signal generating means includes the base and collector of a control transistor coupled between said second and third power sources and a resistor coupled to a collector of said transistor.

31. The logic circuit according to claim 30, wherein said transient signal generating means includes a capacitor, coupled between the collector of said control transistor and the base of said pull-down transistor, and a resistor coupled between the base of said pull-down transistor and the third power source.

* * * * *